United States Patent
Tateda et al.

(10) Patent No.: US 9,762,171 B2
(45) Date of Patent: *Sep. 12, 2017

(54) MOTOR DRIVE DEVICE HAVING INSULATION RESISTANCE DETECTING FUNCTION AND METHOD OF DETECTING INSULATION RESISTANCE OF MOTORS

(71) Applicant: FANUC CORPORATION, Yamanashi (JP)

(72) Inventors: Masaya Tateda, Yamanashi (JP); Hiroyasu Sato, Yamanashi (JP); Akira Hirai, Yamanashi (JP)

(73) Assignee: FANUC CORPORATION, Yamanashi (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/637,478

(22) Filed: Mar. 4, 2015

(65) Prior Publication Data
US 2015/0256116 A1  Sep. 10, 2015

(30) Foreign Application Priority Data
Mar. 5, 2014 (JP) .................. 2014-043136

(51) Int. Cl.
*H02P 1/00* (2006.01)
*H02P 27/06* (2006.01)
(Continued)

(52) U.S. Cl.
CPC ............ *H02P 27/06* (2013.01); *B60L 3/0061* (2013.01); *B60L 3/0069* (2013.01); *B60L 3/04* (2013.01);
(Continued)

(58) Field of Classification Search
CPC ..... H02P 21/141; H02P 21/146; B60W 10/08; Y02T 10/70
(Continued)

(56) References Cited

U.S. PATENT DOCUMENTS 8,115,428 B2 * 2/2012 Williams ............. B62D 5/0481
318/400.02
2006/0022679 A1 * 2/2006 Obata .................... G01R 31/06
324/551
(Continued)

FOREIGN PATENT DOCUMENTS

CN  101769991 A  7/2010
JP  200858088 A  3/2008
(Continued)

OTHER PUBLICATIONS

English Abstract for Japanese Publication No. 2014-033528 A, published Feb. 20, 2014, 1 pg.
(Continued)

*Primary Examiner* — Rina Duda
(74) *Attorney, Agent, or Firm* — Fredrikson & Byron, P.A.

(57) ABSTRACT

A motor drive device includes: a converter; a power supply; a plurality of inverter units configured to convert DC to AC to drive a plurality of motors by upper arm switching elements connected between a capacitor and motor coils and lower arm switching elements connected between the capacitor and motor coils; a second switch configured to connect the capacitor to the earth; a current detector configured to measure current flowing between the capacitor and the earth; a voltage detector configured to measure the voltage across the capacitor; and, an insulation resistance detector configured to detect insulation resistance of the multiple motors based on the current and voltage measured in a condition that the switching element to which the motor coil to be measured is connected is turned on and the switching elements to which a motor coil other than the target for measurement is connected are turned off.

2 Claims, 11 Drawing Sheets

(51) Int. Cl.

| | |
|---|---|
| *H02P 5/74* | (2006.01) |
| *B60L 3/00* | (2006.01) |
| *G01R 31/34* | (2006.01) |
| *H02M 5/458* | (2006.01) |
| *B60L 3/04* | (2006.01) |
| *B60L 11/18* | (2006.01) |
| *B60L 15/00* | (2006.01) |
| G01R 27/02 | (2006.01) |
| G01R 31/02 | (2006.01) |
| H02M 1/00 | (2006.01) |

(52) U.S. Cl.
CPC ....... *B60L 11/1803* (2013.01); *B60L 11/1816* (2013.01); *B60L 15/007* (2013.01); *G01R 31/346* (2013.01); *H02M 5/458* (2013.01); *H02P 5/74* (2013.01); *B60L 2210/30* (2013.01); *B60L 2240/425* (2013.01); *B60L 2240/427* (2013.01); *B60L 2240/429* (2013.01); *B60L 2240/525* (2013.01); *G01R 27/025* (2013.01); *G01R 31/025* (2013.01); *H02M 2001/008* (2013.01); *H02M 2001/0009* (2013.01); *Y02T 10/644* (2013.01); *Y02T 10/645* (2013.01); *Y02T 10/648* (2013.01); *Y02T 10/7005* (2013.01); *Y02T 10/7072* (2013.01); *Y02T 10/7241* (2013.01); *Y02T 90/127* (2013.01); *Y02T 90/14* (2013.01)

(58) Field of Classification Search
USPC .................................. 318/727, 801, 139, 432
See application file for complete search history.

(56) References Cited

U.S. PATENT DOCUMENTS

| | | | | |
|---|---|---|---|---|
| 2006/0158197 A1* | 7/2006 | Horikoshi | ............ | G01R 31/343 324/551 |
| 2010/0171511 A1* | 7/2010 | Horikoshi | .......... | G01R 31/1263 324/551 |

FOREIGN PATENT DOCUMENTS

| | | |
|---|---|---|
| JP | 2010156661 A | 7/2010 |
| JP | 2012154668 A | 8/2012 |
| JP | 5065192 B2 | 10/2012 |
| JP | 2012233826 A | 11/2012 |
| JP | 201433527 A | 2/2014 |
| JP | 201433528 A | 2/2014 |

OTHER PUBLICATIONS

English Abstract for Japanese Publication No. 2014-033527 A, published Feb. 20, 2014, 1 pg.
English Abstract for Japanese Publication No. 2012-154668 A, published Aug. 16, 2012, 1 pg.
English Abstract for Japanese Publication No. 2010-156661 A, published Jul. 15, 2010, 1 pg.
English Abstract for Japanese Publication No. 2008-058088 A, published Mar. 13, 2008, 1 pg.
English abstract and machine translation for Japanese Publication No. JP 5065192 B2, published Oct. 31, 2012, 30 pgs.
English abstract and machine translation for Japanese Publication No. JP 2012-233826 A, published Nov. 29, 2012, 25 pgs.
English Abstract and Machine Translation for Chinese Publication No. 101769991 A, published Jul. 7, 2010, 8 pgs.

* cited by examiner

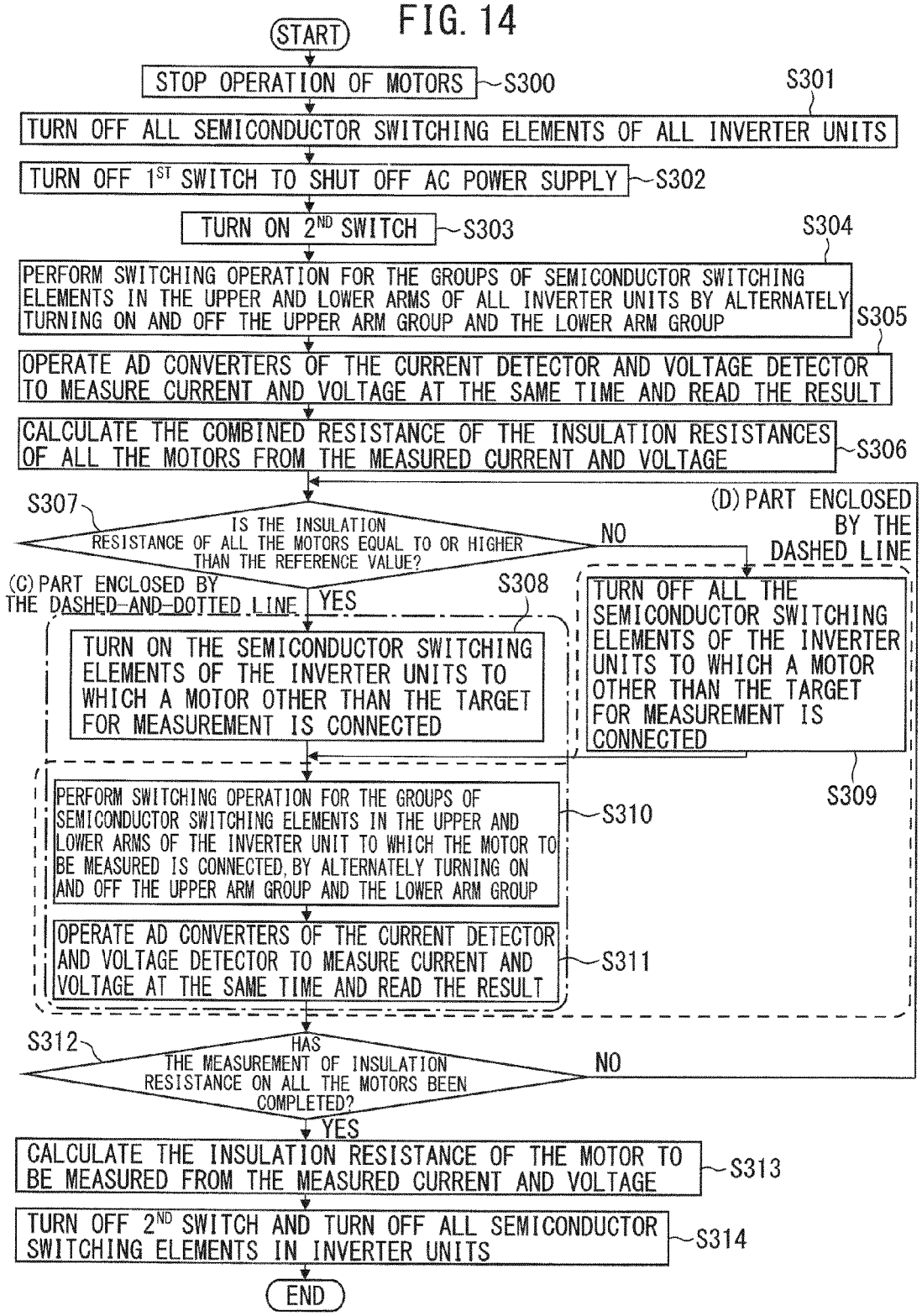

MOTOR DRIVE DEVICE HAVING INSULATION RESISTANCE DETECTING FUNCTION AND METHOD OF DETECTING INSULATION RESISTANCE OF MOTORS

CROSS-REFERENCE TO RELATED APPLICATIONS

This application is a new U.S. patent application that claims benefit of JP 2014-043136, filed on Mar. 5, 2014, the entire content of JP 2014-043136 is hereby incorporated by reference.

FIELD OF THE INVENTION

The present invention relates to a motor drive device and a method of detecting insulation resistance of motors, in particular relating to a motor drive device having functions of correctly measuring and detecting insulation resistance of motors as well as a method of detecting insulation resistance of motors, without receiving influence from currents flowing through semiconductor switching elements in inverter units

BACKGROUND OF THE INVENTION

Conventionally, there have been known motor drive devices that have a function of detecting insulation resistance of motor winding by applying a voltage charged on a smoothing capacitor in a direct current (DC) link unit, between the motor winding (coil) and the earth (e.g., Japanese Patent No. 5065192 (JP 5065192B), which will be referred to hereinbelow as 'Patent Document 1' and Japanese Laid-open Patent publication No. 2012-233826 (JP 2012-233826A), which will be referred to hereinbelow as 'Patent Document 2'). Patent Document 1 discloses a motor drive device having an insulation resistance detecting function. In this conventional motor drive device, after shutting off an alternate current (AC) power supply by a switch, a smoothing capacitor of a DC power supply (DC link unit) connected to the inverter unit is connected at its one end to the earth while a plurality of semiconductor switching elements connected to the other end of the smoothing capacitor are turned on, one by one in a predetermined order. By this operation, a closed circuit formed of the smoothing capacitor, the ground, the motor coil and the on-state semiconductor switching element is created to thereby detect the current flowing through this closed circuit with a current detection circuit and determine the insulation resistance of a motor.

Further, Patent Document 1 discloses a method of detecting insulation resistance of a motor to be detected, in a motor drive device equipped with a plurality of inverter units for driving a plurality of motors. First, an arbitrary motor to be detected is selected from a plurality of motors, and only the semiconductor switching elements of the inverter unit to which the motor selected to be detected is connected are turned on. Next, the semiconductor switches of all of the inverter units to which a motor other than the target for measurement is connected are kept off. As a result, a closed circuit that passes through the insulation resistance of the motor to be detected among the plural motors is formed so that the insulation resistance of the detection-target motor is detected.

Patent Document 2 discloses a method of detecting insulation resistance of a motor to be measured that is able to realize detection of insulation resistance similar to that in Patent Document 1, also in a motor drive device that uses bootstrap circuits in the drive circuitry for semiconductor switching elements in an upper arm of the inverter unit. First, as to at least a pair of upper and lower arm semiconductor switching elements in the inverter unit to which the motor to be measured is connected, one switching element is turned on while the other is turned off. Then the first one is turned off while the second is turned on. This on-and-off operation is repeated by use of a PWM (Pulse Width Modulation) signal of the same duty ratio. With this operation, a closed circuit passing through the insulation resistance of the motor coil of the motor to be measured is formed so as to detect the insulation resistance of the motor to be measured based on the current flowing through this closed circuit and the voltage across the smoothing capacitor.

In Patent Document 1, the semiconductor switching elements of the inverter unit to which the motor to be measured are kept on-state at the time of measurement. In contrast to this, Patent Document 2 is different in that repeating switching operation is performed, or the semiconductor switching elements in the upper and lower arms of the inverter unit to which the motor to be measured is connected are alternately turned on by use of the PWM signal.

In Patent Document 2, the reason why the switching operation in which the upper and lower arm semiconductor switching elements are alternately turned on and off is that since the drive circuit for the semiconductor switching element of the upper arm is formed of a bootstrap circuit, the upper arm semiconductor switching element becomes unable to be turned on unless the bootstrap circuit for the upper arm semiconductor switching element is charged by turning on the lower arm semiconductor switching element.

The embodiment of Patent Document 2 describes that insulation resistance is measured by applying a positive power supply from the smoothing capacitor to the motor coil of the motor to be measured during the period in which the upper arm semiconductor switching element is turned on, then charging operation of the bootstrap circuit of the upper arm semiconductor switching element is performed during the period in which the lower arm semiconductor switching element is turned on.

In order to measure insulation resistance, only the semiconductor switching elements of the inverter unit to which the motor selected as a detection target is connected, are turned on while all the other semiconductor switching elements of the inverter units to which a motor other than the target for measurement is connected are kept off-state. In this way, a closed circuit that passes through the insulation resistance of the detection-target motor among the plural motors is formed so as to measure the insulation resistance of the detection-target motor. This is the common feature both in Patent Document 2 and Patent Document 1.

In the prior art described in Patent Document 1 and Patent Document 2, for the motor drive device having a plurality of intervener units for driving a plurality of motors, the semiconductor switching elements originally equipped in the inverter units are used as the selector switches for selecting a detection-target motor from plural motors. Therefore, it is not necessary to separately provide as many switches as the number of motors in order to select a detection target. Further, since insulation resistance can be measured on the plural motors by use of a single detecting circuit, the prior art methods are excellent in being able to realize measurement with simple and low-cost configurations.

However, the prior art methods described in Patent Document 1 and Patent Document 2 entail the problem that when, in the motor drive device including a plurality of inverter units that drive a plurality of motors, a specific detection-target motor is selected from plural motors to measure insulation resistance, if even one of the motors other than the detection target is low in insulation resistance, the measurement accuracy lowers in a high-temperature condition under which leakage current through semiconductor switching elements increases.

FIG. 1 illustrates a configuration of a motor drive device 1000 including two inverter units for driving two motors, according to the prior art disclosed in Patent Document 1. In the example of FIG. 1, description will be made on a case where a first motor 1061 is selected from the two motors as a target for measurement so that the insulation resistance of the first motor 1061 is measured.

The procedures of measuring the insulation resistance of a motor using the conventional motor drive device are as follows. To begin with, in FIG. 1, while all of semiconductor switching elements (IGBTs) 10511 to 10561, 10512 to 10562 in all inverter units 1051 and 1052 have been turned off, a first switch 1001 is turned off so as to cut off an AC power supply 1002. Next, a second switch 1009 is turned on so that a minus-side terminal 1043 of a DC link unit 1004 is connected to the earth. FIG. 2 represents an equivalent circuit of the connection of insulation resistance between the IGBTs and the motor in the above condition.

Next, as a result of the first motor 1061 having been selected as a target for measurement, the IGBT 10511 of the U-phase upper arm of the first inverter unit 1051 to which the first motor 1061 is connected is turned on so as to create a closed circuit (indicated by the broken line in FIG. 1) passing through the insulation resistance between motor coils 10611-10631 of the first motor 1061 to be measured and the earth to thereby measure the current flowing through the closed circuit by means of a current detector 1007. At the same time, the DC link voltage is measured by a voltage detector 1008 to determine the insulation resistance between the motor and the earth from the measured voltage and current.

FIG. 3 depicts the equivalent circuit at the time of this measurement of insulation resistance. Since one of the upper arm IGBTs (10511, 10531, 10551) in the first inverter unit 1051 is changed to off-state from the state illustrated in FIG. 2, FIG. 3 is the equivalent circuit of the circuit illustrated in FIG. 2 in which the equivalent insulation resistance RU-IGBT1 of the upper arm IGBTs (10511, 10531, 10551) in the first inverter unit 1051 is short-circuited.

In FIGS. 2 and 3, RU-IGBT1 and RU-IGBT2 represent the equivalent insulation resistances of upper arm IGBTs (10511, 10531, 10551) in the first inverter unit 1051 and upper arm IGBTs (10512, 10532, 10552) in the second inverter unit 1052 in their off-state, respectively; RD-IGBT1 and RD-IGBT2 represent the equivalent insulation resistances of lower arm IGBTs (10521, 10541, 10561) in the first inverter unit 1051 and lower arm IGBTs (10522, 10542, 10562) in the second inverter unit 1052 in their off-state, respectively; Rm1 and Rm2 represent the insulation resistances between the motor coils (10611 to 10631) of the first motor 1061 and between the motor coils (10612 to 10632) of the second motor 1062 and the earth, respectively; and Rc represents the series of a voltage dividing resistance 1072 of the current detector 1007 and a current detection resistance 1071 as a single resistance.

In the case of a three-phase inverter for driving a three-phase motor illustrated in FIG. 1, one inverter unit includes three semiconductor switching elements (IGBTs) in each of the upper and lower arms. The three IGBTs of the upper arm as well as the lower arm in one inverter are connected in parallel with their collector terminals joined together with the DC link unit and their emitter terminals joined via the motor coils inside the motor. For this reason, the three IGBTs in the upper arm or in the lower arm in the inverter are represented as a single equivalent insulation resistance in the equivalent circuits in FIGS. 2 and 3.

In the prior art, in the motor drive device including a plurality of inverter units for driving a plurality of motors, when insulation resistance is detected by selecting a specific motor to be measured, the leakage currents flowing through the insulation resistance of the motors other than that the target for measurement and the off-state semiconductor switching elements connected to those motors are superposed over the measurement current flowing through the current detector. As a result, in particular, when the motor drive device have a large number of motors connected to hereto and if the insulation resistances of the motors other than the target for measurement are lowered, there occurs the problem that the measurement accuracy in the insulation resistance measurement of the specific motor to be measured markedly lowers in a high-temperature condition under which leakage currents through semiconductor switching elements increase.

In the above description, 'the leakage current flowing through the off-state semiconductor switching element' in the example of an IGBT, corresponds to the leakage current flowing from the collector to the emitter when the IGBT is in off-state.

This leakage current in off-state is defined as an electric characteristic represented by a symbol $I_{CES}$ in IGBT, and is called 'collector-emitter leakage current'. The collector-emitter leakage current ($I_{CES}$) is defined as the leakage current flowing from the collector to the emitter when the gate and the emitter are short-circuited, i.e., when the rated voltage is applied between the collector and the emitter with the IGBT totally shut off.

The IGBT collector-emitter leakage current ($I_{CES}$) is greatly dependent on temperature, specifically, the leakage current $I_{CES}$ increases exponentially with a rise in temperature.

The characteristic of increase in leakage current at off-state with a rise in temperature is not limited to IGBTs, but it has been known that a similar characteristic is found also in other semiconductor switching elements such as MOS-FETs, and the like. For example, the similar electric characteristic in a case of MOS-FET is defined as the leakage current between drain and source at off-state, which is represented by a symbol $I_{DSS}$.

In general, the reason why increase of leakage current $I_{CES}$ in IGBTs for use in inverters for motor drive is regarded as a problem is mainly in view of loss increase. However, when IGBTs in the inverter unit are used as the selector switches for the motor to be measured on insulation resistance as in the prior art disclosed in Patent Document 1 and Patent Document 2, even a leakage current $I_{CES}$ as low as a level of some tens μA, which will not cause any problem in view of loss, will cause degradation of measurement accuracy in the prior art measurement of insulation resistance of motors.

Specifically, as apparent from FIG. 3, the problem of the prior art resides in that superposed over the actual current (the dashed line with arrows in FIG. 3) to be measured, flowing through the insulation resistance Rm1 between the first motor to be measured and the earth, part of the leakage current flowing through the off-state semiconductor switching element RU-IGBT2 connected to the second motor other than the target for measurement directly flows into the current detector 1007 by way of the insulation resistance Rm2 of the second motor other than the target for measurement (the dashed-and-dotted line with arrows in FIG. 3).

If the semiconductor switching element is an ideal selector switch, it can be considered that as long as the semiconductor switching element is set in off-state, the motors other than the target for measurement and the DC link unit are separated by the off-state semiconductor switching elements so that no current will flow. However, since the actual semiconductor switching element even in its off-state will permit leakage current to flow at a level that affects the measurement accuracy of the insulation resistance measurement when a voltage is applied in a high-temperature condition, a great caution has to be given.

The leakage current that generates measurement error flows through the semiconductor switching element RU-IGBT2 of the inverter unit connected to the second motor other than the target for measurement and the insulation resistance Rm2 of the second motor other than the target for measurement, as illustrated in FIG. 3. Accordingly, even with the prior art, if the summed insulation resistance of the insulation resistance Rm2 of the second motor other than the target for measurement and the equivalent insulation resistance of the semiconductor switching element RU-IGBT2 connected to the second motor is sufficiently high compared to the insulation resistance Rm1 of the first motor to be measured, the measurement accuracy of the insulation resistance Rm1 of the first motor to be measured will not become so low as to pose a practical problem.

However, when considering the use purpose of exactly measuring the insulation resistance of every motor by switching the target for measurement for all the plural motors and identifying a motor if there is any that is lowered in insulation resistance, it is considered in practical operation that there are many cases where there are some motors that are lowered in insulation resistance, among the plural motors.

If there is a motor that is lowered in insulation resistance, there necessarily occurs the case where the motor lowered in insulation resistance is included in the motors other than the target for measurement in the course of measuring the insulation resistance of every motor by switching the target for measurement. Further, since the semiconductor switching element connected to the motor that has been lowered in insulation resistance could present a low equivalent insulation resistance due to high temperature, high-accuracy measurement is demanded for such cases.

It is assumed that as a motor other than the target for measurement a motor with degraded insulation resistance as low as, for example 1 [MΩ] is connected. In this case, if, as a tentative value, the total resistance of the equivalent insulation resistance of the semiconductor switching element in its off-state plus 1 [MΩ] is sufficiently greater than the insulation resistance of the motor to be measured, it is not considered that any trouble that produces serious influence on measurement accuracy will occur. However, when the total resistance is approximately equal to or lower than the insulation resistance of the motor to be measured, it is practically impossible to achieve high-accuracy measurement of insulation resistance.

FIG. 4 is a graph that represents the behavior of the collector-emitter leakage current ($I_{CES}$), specifically, a leakage current flowing through an IGBT with a withstanding voltage of 1200 [V] that is typically used in the industrial inverter units, depending on the temperature.

FIG. 4 is a graph that has been obtained by measuring leakage current in circuitry where three IGBTs in the upper arm are connected in parallel with their collectors joined together and emitters joined together, on the assumption of application to a three-phase inverter unit. Similarly to this, the graph obtained by the measurement with the three lower arm IGBTs connected in parallel, exactly coincides with the graph for the upper arm. Therefore, the graph in FIG. 4 is represented by a single line.

Table 1 is a table showing equivalent insulation resistances of the IGBT between collector and emitter at different temperatures, determined by dividing the applied voltage, 1200 [V] between collector and emitter, by the leakage current flowing from collector to emitter, read from the graph in FIG. 4.

TABLE 1

| IGBT's Junction Temperature | IGBT's Leakage Current $I_{CES}$ | IGBT's Equivalent Insulation Resistance |
|---|---|---|
| 25° C. | 0.3 μA | 4 GΩ |
| 80° C. | 40 μA | 30 MΩ |
| 100° C. | 200 μA | 6 MΩ |

Referring to FIG. 4 and Table 1, description will be made on how the leakage current of the IGBT at each temperature gives influence on the measurement of insulation resistance of the prior art.

At normal temperature (25[° C.]) the leakage current in the IGBT's off-state is as low as 0.3 [μA], which corresponds to an equivalent insulation resistance of about 4 [GΩ]. This value is sufficiently high compared to the insulation resistance of the motor to be measured (100 [MΩ] to 1 [MΩ]). Accordingly, even if a motor with an insulation resistance of 1 [MΩ] or below is connected as one of the motors other than the target for measurement, it is considered that there is little influence on measurement accuracy of the insulation resistance of the motor at normal temperature.

However, as the temperature of IGBT becomes higher, the leakage current becomes greater exponentially. At a junction temperature $T_j$ of 80[° C.], the IGBT leakage current $I_{CES}$ is 40 [μA], this corresponding to an IGBT equivalent insulation resistance of 30 [MΩ]. In this case, if the insulation resistance of any of the motors other than the target for measurement is lowered to about 1 [MΩ], this level of insulation resistance will influence the accuracy of measuring the insulation resistance of the motor by the prior art method.

Further, when the junction temperature $T_j$ rises up to 100[° C.], the leakage current $I_{CES}$ in the IGBT's off-state increases to about 200 [μA], which corresponds to an equivalent insulation resistance of about 6 [MΩ]. In this case, even if the insulation resistance of 1 [MΩ] of the motor other than the target for measurement is added, the sum is as low as, or becomes lower than, the insulation resistance value of the motor to be measured. As a result, it is practically difficult to measure insulation resistance with high accuracy.

As described heretofore, in the case where IGBTs having the characteristic illustrated in FIG. 4 are used, if the insulation resistance of any of the motors other than the target for measurement is lowered, accurate detection of insulation resistance can be only done in a limited temperature range, or at around normal temperature or below in the prior art. For example, in a high temperature state directly after the operation of the motors by the inverter units, if even one of the motors other than the target for measurement has a lowered insulation resistance, it is understood that there occurs a problem that the accuracy of detecting the insulation resistance of the motor to be measured is deteriorated especially when high insulation resistance is measured.

Even with the prior art disclosed in Patent Document 1 and Patent Document 2, in the motor drive device including a plurality of inverter units for driving a plurality of motors, only when all the motors connected to the motor drive device are made to be the target for measurement so that the insulation resistance of all the motors is collectively measured, at least one of the plural semiconductor switching elements of the inverter unit connected to each motor is in on-state at the time of measurement so that there is no inverter unit in which all the semiconductor switching elements are in off-state. As a result, the problem of lowered measurement accuracy will not occur theoretically due to influence of the leakage current flowing through a semiconductor switching element in its off-state as described above, hence it is possible to achieve high-accuracy measurement.

The measurement result obtained by this method of measuring all the motors collectively, gives the combined resistance of all the insulation resistances connected in parallel. Accordingly, if the measured value of insulation resistance obtained by this method is at a sufficiently high level free from problems, it is possible to determine that the insulation resistances of all the motors are free from insulation deterioration.

However, when the measured value of insulation resistance obtained by this method is at such a low level as to pose a problem, it is possible to know that at least one of the motors has been lowered in insulation resistance, but it is impossible to obtain any information to identify which motor has been degraded in insulation resistance.

In order to identify which motor among the plural motors has been degraded in insulation resistance, it is necessary to measure insulation resistance by selecting a specific motor, one by one, from all the motors. However, as described above the prior art measurement in this condition entails the problem that measurement accuracy is degraded especially when the temperature is high.

The motor drive devices having an insulation resistance detecting function for motors are built in machine tools and others and mainly utilized for maintenance and preservation activities of the tools on production sites in factories. In the preservation activities on the production site in the factory, when insulation degradation has taken place in any one of plural motors, the task of finding the fact of occurrence is important. However, in order to trouble-shoot it is also important to identify which motor has been degraded in insulation, at the same time.

In the measurement for identifying the motor that is degraded in insulation resistance from plural motors, the prior art problem, in particular, the degradation of measurement accuracy at the time of high temperatures, has been demanded to improve from an operational viewpoint on the production site.

The present invention has been devised in view of the problems described above, it is therefore an object of the present invention to provide a motor drive device including a plurality of inverter units for driving a plurality of motors, which can be constructed with a simple structure, which, when the insulation resistance of a specific motor among the plural motors including a motor degraded in insulation resistance is measured, enables exact measurement of the insulation resistance of the motor and correct detection of insulation deterioration even at high temperatures by using semiconductor switching elements originally provided for the inverter units as the selector switches for selecting a specific motor from the plural motors, without being affected from leakage currents flowing through semiconductor switching elements connected to the motors other than the target for measurement.

SUMMARY OF THE INVENTION

A motor drive device according to one embodiment of the present invention includes: a converter unit having a rectifier circuit configured to rectify AC voltage supplied from an AC power supply via a first switch into DC voltage; a power supply unit configured to smooth the DC voltage rectified by the rectifier circuit through a capacitor; a plurality of inverter units configured to convert the DC voltage from the power supply unit to AC voltage to drive multiple motors, respectively, by switching operation of semiconductor switching elements in an upper arm, connected between a positive-side terminal of the capacitor and a motor coil as well as semiconductor switching elements in a lower arm, connected between a negative-side terminal of the capacitor and the motor coil; a second switch configured to connect one terminal of the capacitor to the earth; a current detector configured to measure current flowing between the one terminal of the capacitor and the earth; a voltage detector configured to measure voltage between both ends of the capacitor; and, an insulation resistance detector configured to detect insulation resistance which is resistance between a motor coil of a motor selected as a target for measurement and the earth, based on current and voltage measured in a condition that operation of the motors is stopped, the first switch is turned off, the second switch is turned on, semiconductor switching elements connected between the other terminal of the capacitor and the motor coil, among the semiconductor switching elements in the upper or lower arm to which the motor coil of the motor to be measured is connected are turned on, and the semiconductor switching elements connected between the one terminal of the capacitor and the motor coil, among the semiconductor switching elements in the upper or lower arm to which a motor coil of a motor other than the motor to be measured is connected are turned on.

A method of detecting insulation resistance of motors according to one embodiment of the present invention includes the steps of: rectifying AC voltage supplied from an AC power supply via a first switch into DC voltage, by means of a rectifier circuit; smoothing the DC voltage rectified by the rectifier circuit through a capacitor, by a power supply unit; converting the DC voltage from the power supply unit to AC voltage to drive multiple motors, respectively by a plurality of inverter units based on switching operation of semiconductor switching elements in an upper arm, connected between a positive-side terminal of the capacitor and a motor coil as well as semiconductor switching elements in a lower arm, connected between a negative-side terminal of the capacitor and the motor coil; connecting one terminal of the capacitor to the earth by a second switch; measuring current flowing between the one terminal of the capacitor and the earth by a current detector; measuring voltage between both ends of the capacitor by a voltage detector; stopping the operation of the motors and turning off the first switch; setting the second switch into on-state; turning on the semiconductor switching elements that are connected between the other terminal of the capacitor and the motor coil, among the semiconductor switching elements in the upper or lower arm to which the motor coil of the motor to be measured is connected; turning on the semiconductor switching elements connected between the one terminal of the capacitor and the motor coil, among the semiconductor switching elements in the upper or lower arm to which a motor coil of a motor other than the motor to be measured is connected; measuring current by the current detector and measuring voltage by the voltage detector; and, detecting insulation resistance which is a resistance between a motor coil of a motor selected as a target for measurement and the earth, based on the measured current and voltage.

A motor drive device according to another embodiment of the present invention includes: a converter unit having a rectifier circuit configured to rectify AC voltage supplied from an AC power supply via a first switch into DC voltage; a power supply unit configured to smooth the DC voltage rectified by the rectifier circuit through a capacitor; a plurality of inverter units that convert the DC voltage from the power supply unit to AC voltage to drive multiple motors, by switching operation of semiconductor switching elements in an upper arm, connected between a positive-side terminal of the capacitor and a motor coil as well as semiconductor switching elements in a lower arm, connected between a negative-side terminal of the capacitor and the motor coil; a second switch that connects the negative-side terminal of the capacitor to the earth; a current detector configured to measure the current flowing between the negative-side terminal of the capacitor and the earth; a voltage detector configured to measure voltage between both ends of the capacitor; and an insulation resistance detector configured to detect insulation resistance of each of the multiple motors driven by the plurality of inverter units, and is characterized in that the drive circuit of semiconductor switching elements in the upper arm is formed of a bootstrap circuit, and the insulation resistance detector detects the insulation resistance of the motor to be measured based on the measured current and voltage in the condition that operation of the motors is stopped, the first switch is turned off, the second switch is turned on, switching operation is performed for groups of semiconductor switching elements in the upper and lower arms to which the coil of the motor to be measured is connected, by turning on and off the group of semiconductor switching elements in the upper arm and the group of semiconductor switching elements in the lower arm, alternately, so as to charge the bootstrap circuits in the upper arm when the semiconductor switching elements in the lower arm are in on-state, and the semiconductor switching elements in the lower arm of the inverter units to which a motor other than the motor to be measured is connected are turned on.

A motor drive device according to still another embodiment of the present invention includes: a converter unit having a rectifier circuit configured to rectify AC voltage supplied from an AC power supply via a first switch into DC voltage; a power supply unit configured to smooth the DC voltage rectified by the rectifier circuit through a capacitor; a plurality of inverter units configured to convert the DC voltage from the power supply unit to AC voltage to drive multiple motors, respectively, by switching operation of semiconductor switching elements in an upper arm, connected between a positive-side terminal of the capacitor and a motor coil as well as semiconductor switching elements in a lower arm, connected between a negative-side terminal of the capacitor and the motor coil; a second switch configured to connect one terminal of the capacitor to the earth; a current detector configured to measure current flowing between the one terminal of the capacitor and the earth; a voltage detector configured to measure voltage between both ends of the capacitor; and an insulation resistance detector configured to detect insulation resistance of each of the multiple motors driven by the plurality of inverter units, and is characterized in that the insulation resistance detector determines combined resistance of the insulation resistance of all the motors from the measured current value by the current detector and the measured voltage value by the voltage detector in a condition that operation of the motors is stopped, the first switch is turned off, the second switch is turned on, and semiconductor switching elements connected between the other terminal of the capacitor and the motor coil among the semiconductor switching elements in either the upper or lower arm in all the inverter units is turned on, when the combined resistance is equal to or higher than a reference value, the insulation resistance detector determines insulation resistance of the motor selected as a target for measurement from the measured current by the current detector and the measured voltage by the voltage detector in a condition that semiconductor switching elements connected between the other terminal of the capacitor and the motor coil among the semiconductor switching elements in either the upper or lower arm of the inverter unit to which an arbitral motor selected as a target for measurement is connected are turned on, and the semiconductor switching elements connected between the first terminal of the capacitor and the motor coil among the semiconductor switching elements in either the upper or lower arm of the inverter units to which a motor other than the motor to be measured is connected are turned on, and when the combined resistance value is lower than the reference value, the insulation resistance detector determines insulation resistance of the motor selected as a target for measurement from the measured current by the current detector and the measured voltage by the voltage detector in a condition that the semiconductor switching elements connected between the other terminal of the capacitor and the motor coil among the semiconductor switching elements in either the upper or lower arm of the inverter unit to which an arbitral motor selected as a target for measurement is connected are turned on, and all the semiconductor switching elements of the inverter units to which a motor other than the motor to be measured is connected are turned off.

A motor drive device of a further embodiment of the present invention includes: a converter unit having a rectifier circuit configured to rectify AC voltage supplied from an AC power supply via a first switch into DC voltage; a power supply unit configured smooth the DC voltage rectified by the rectifier circuit through a capacitor; a plurality of inverter units configured to convert the DC voltage from the power supply unit to AC voltage to drive multiple motors, respectively, by switching operation of semiconductor switching elements in an upper arm, connected between a positive-side terminal of the capacitor and the motor coil as well as semiconductor switching elements in a lower arm, connected between a negative-side terminal of the capacitor and the motor coil; a second switch configured to connect the negative-side terminal of the capacitor to the earth; a current detector configured to measure the current flowing between the negative-side terminal of the capacitor and the earth; a voltage detector configured to measure voltage between both ends of the capacitor; and, an insulation resistance detector configured to detect insulation resistance of the multiple motors driven by the plurality of inverter units, and is characterized in that the drive circuit of semiconductor switching elements in the upper arm is formed of a bootstrap circuit, the insulation resistance detector determines combined resistance of the insulation resistance of all the motors from measured current by the current detector and measured voltage by the voltage detector in a condition that the operation of the motors is stopped, the first switch is turned off, and the second switch is turned on, switching operation is performed for groups of semiconductor switching elements in the upper and lower arms of all the inverter units, by turning on and off the group of semiconductor switching elements in the upper arm and the group of semiconductor switching elements in the lower arm, alternately, so as to charge the bootstrap circuits in the upper arm when the semiconductor switching elements in the lower arm are in on-state, when the combined resistance is equal to or higher than a reference value, the insulation resistance detector determines the insulation resistance of the motors selected as the target for measurement from measured current by the current detector and measured voltage by the voltage detector in a condition that switching operation of alternately turning on and off the group of semiconductor switching elements in the upper arm and the group of semiconductor switching elements in the lower arm in the inverter unit to which an arbitrary motor selected to be measured is connected is performed, so as to charge the bootstrap circuits in the upper arm when the semiconductor switching elements in the lower arm are in on-state, the semiconductor switching elements in the lower arm of the inverter units to which a motor other than the target for measurement is connected are set in on-state, and, when the combined resistance is lower than the reference value, the insulation resistance detector determines the insulation resistance of the motor selected as the target for measurement from the measured current by the current detector and the measured voltage by the voltage detector in the condition that switching operation of alternately turning on and off the group of upper arm semiconductor switching elements and the group of lower arm semiconductor switching elements in the inverter unit to which an arbitrary motor selected as the target for measurement is connected is performed, so as to charge the bootstrap circuits in the upper arm when the semiconductor switching elements in the lower arm are in on-state, and all the semiconductor switching elements of the inverter units to which a motor other than the target for measurement is connected are set in off-state.

DESCRIPTION OF THE DRAWINGS

These and other features and advantages of the present invention will be better understood by reading the following detailed description, taken together with the drawings wherein.

DETAILED DESCRIPTION OF THE PREFERRED EMBODIMENT

Figure 1:
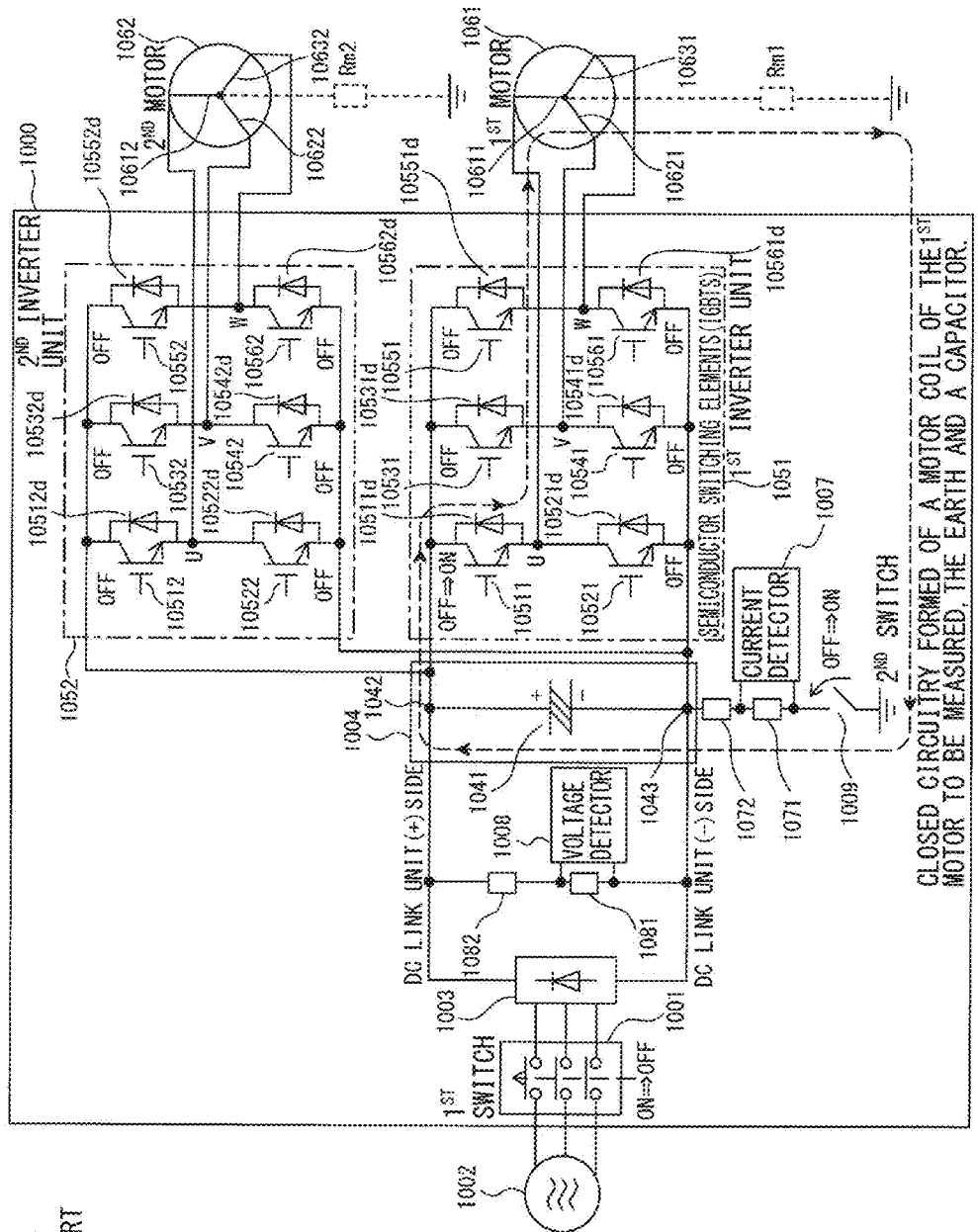
FIG. 1 is a configurational diagram of a conventional motor drive device.
Figure 2:
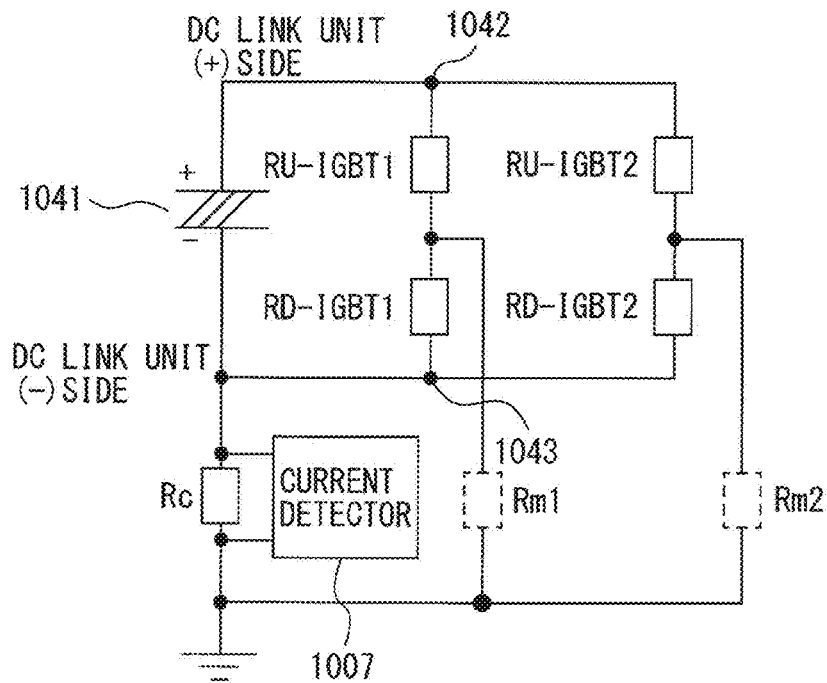
FIG. 2 is an equivalent circuit diagram illustrating connection of insulation resistances between IGBTs, motors and the earth in a conventional motor drive device.
Figure 3:
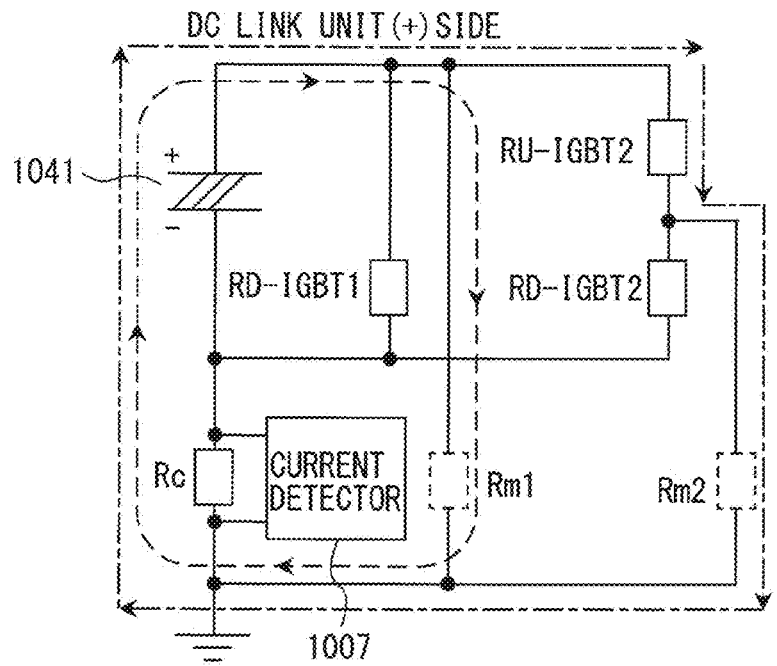
FIG. 3 is an equivalent circuit diagram at the time of measuring insulation resistance in a conventional motor drive device.
Figure 4:
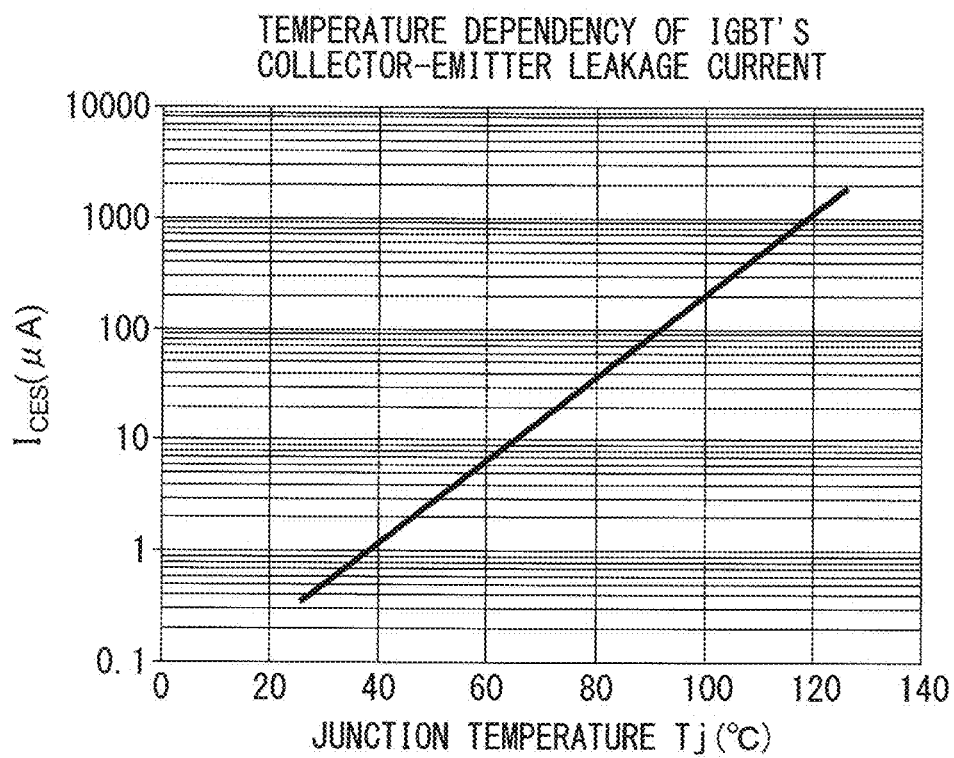
FIG. 4 is a graph that represents the relationship between the collector-emitter leakage current ($I_{CES}$) as the leakage current when an IGBT is in off-state, and the temperature.
Figure 5:
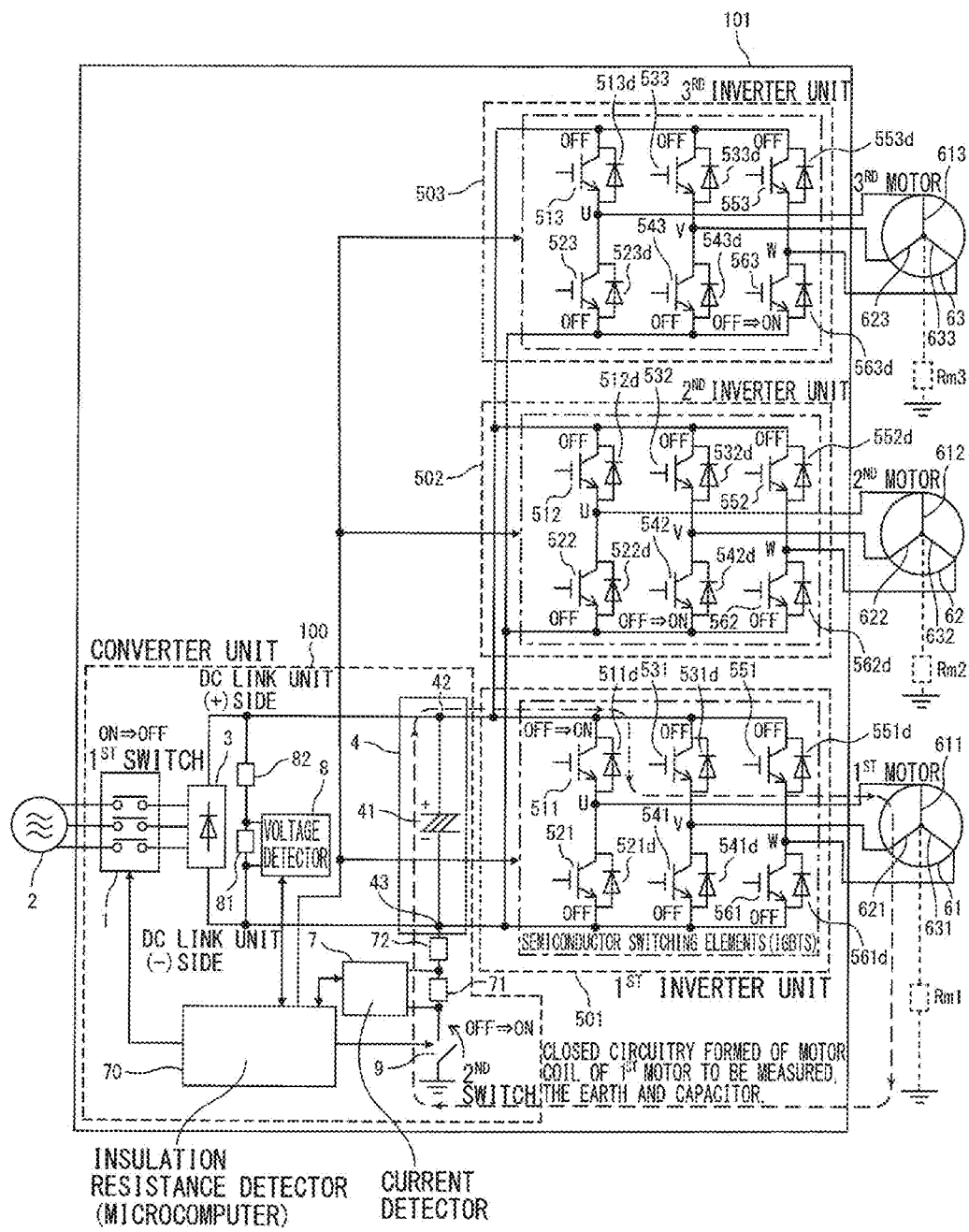
FIG. 5 is a configurational diagram of a motor drive device including an insulation resistance detector according to the first embodiment of the present invention.

Next, by reference to the drawings, description will be made on a motor drive device having a function of detecting insulation resistance and an insulation resistance detecting method of motors according to the present invention. However, it should be noted that the technical scope of the present invention is not limited by the embodied mode of these but embraces the invention defined by the claims and equivalence First Embodiment To begin with, a motor drive device according to a first embodiment of the present invention will be described. FIG. 5 is a configurational diagram of a motor drive device including an insulation resistance detector according to the first embodiment of the present invention.

A motor drive device 101 according to the first embodiment of the present invention includes: a converter unit 100 having a rectifier circuit 3 configured to rectify AC voltage supplied from an AC power supply 2 via a first switch 1 into DC voltage; a power supply unit 4 configured to smooth the DC voltage rectified by the rectifier circuit 3 through a capacitor 41; a plurality of inverter units 501 to 503 configured to convert the DC voltage from the power supply unit 4 to AC voltage to drive multiple motors 61 to 63, respectively, by switching operation of the semiconductor switching elements (511, 531, 551, 512, 532, 552, 513, 533, 553) in an upper arm, connected between a positive-side terminal of the capacitor 41, i.e., the DC link unit plus-side terminal 42 and a motor coil (611-631, 612-632, 613-633), as well as the semiconductor switching elements (521, 541, 561, 522, 542, 562, 523, 543, 563) in the lower arm, connected between the negative-side terminal of the capacitor 41, i.e., the DC link unit minus-side terminal 42, and the motor coil (611 to 631, 612-632, 613-633); a second switch 9 configured to connect one terminal of the capacitor 41 to the earth; a current detector 7 configured to measure current flowing between the one terminal of the capacitor 41 and the earth; a voltage detector 8 configured to measure voltage between both ends of the capacitor 41; and, an insulation resistance detector 70 that detects insulation resistance which is resistance between a motor coil of a motor selected as a target for measurement and the earth, based on current and voltage measured in a condition that operation of the motors 61 to 63 is stopped, the first switch 1 is turned off, the second switch 9 is turned on, semiconductor switching elements connected between the other terminal of the capacitor 41 and the motor coil, among the semiconductor switching elements in the upper or lower arm to which the motor coil of the motor to be measured is connected are turned on, and the semiconductor switching elements connected between the one terminal of the capacitor and the motor coil, among the semiconductor switching elements in the upper or lower arm to which a motor coil of a motor other than the motor to be measured is connected are turned on.

FIG. 5 shows an embodiment including a single power supply unit 4 to which a first inverter unit 501 for driving a first motor 61, a second inverter unit 502 for driving a second motor 62 and a third inverter unit 503 for driving a third motor 63 are connected. Rm1, Rm2 and Rm3 represent insulation resistances between the earth, and the motor coil of the first motor 61, the second motor 62, the third motor 63, respectively.

Though FIG. 5 illustrates an example of a motor drive device for driving three motors 61 to 63, it goes without saying that the number of motors in the present invention is not limited to this.

The motor drive device 101 according to the first embodiment of the present invention is characterized, as illustrated in FIG. 5, by inclusion of the converter unit 100 having the rectifier circuit 3 for rectifying power supplied from the AC power supply 2 via the first switch 1; the capacitor 41 for smoothing the output from the rectifier circuit 3; the first inverter unit 501, second inverter unit 502 and third inverter unit 503 that convert DC power from the power supply unit 4 (DC link unit) into AC power by switching operation of semiconductor switching elements (IGBTs) to drive motors 61 and 63, respectively; and the insulation resistance detector 70 that detects insulation resistances Rm1, Rm2 and Rm3 of the respective first motor 61, second motor 62 and third motor 63 driven by the first inverter unit 501, second inverter unit 502 and third inverter unit 503, respectively.

In order for measurement of insulation resistance, the motor drive device 101 according to the first embodiment of the present invention further includes: the second switch 9 that connects one end (the DC link unit minus-side terminal 43) of the capacitor 41 to the earth; the current detector 7 (and an AD converter (not illustrated) for converting the output into a digital value) for measuring the current flowing between one end (e.g., the DC link unit minus-side terminal 43) of the capacitor 41 and the earth when the second switch 9 is turned on; and a voltage detector 8 (and an AD converter (not illustrated) for converting the output into a digital value) for measuring the voltage across the capacitor 41.

This embodiment will be described on a case where, of the three motors, namely, the first motor 61, second motor 62 and third motor 63, the first motor 61 is selected as a target for measurement to measure the insulation resistance of the first motor 61.

Figure 6:
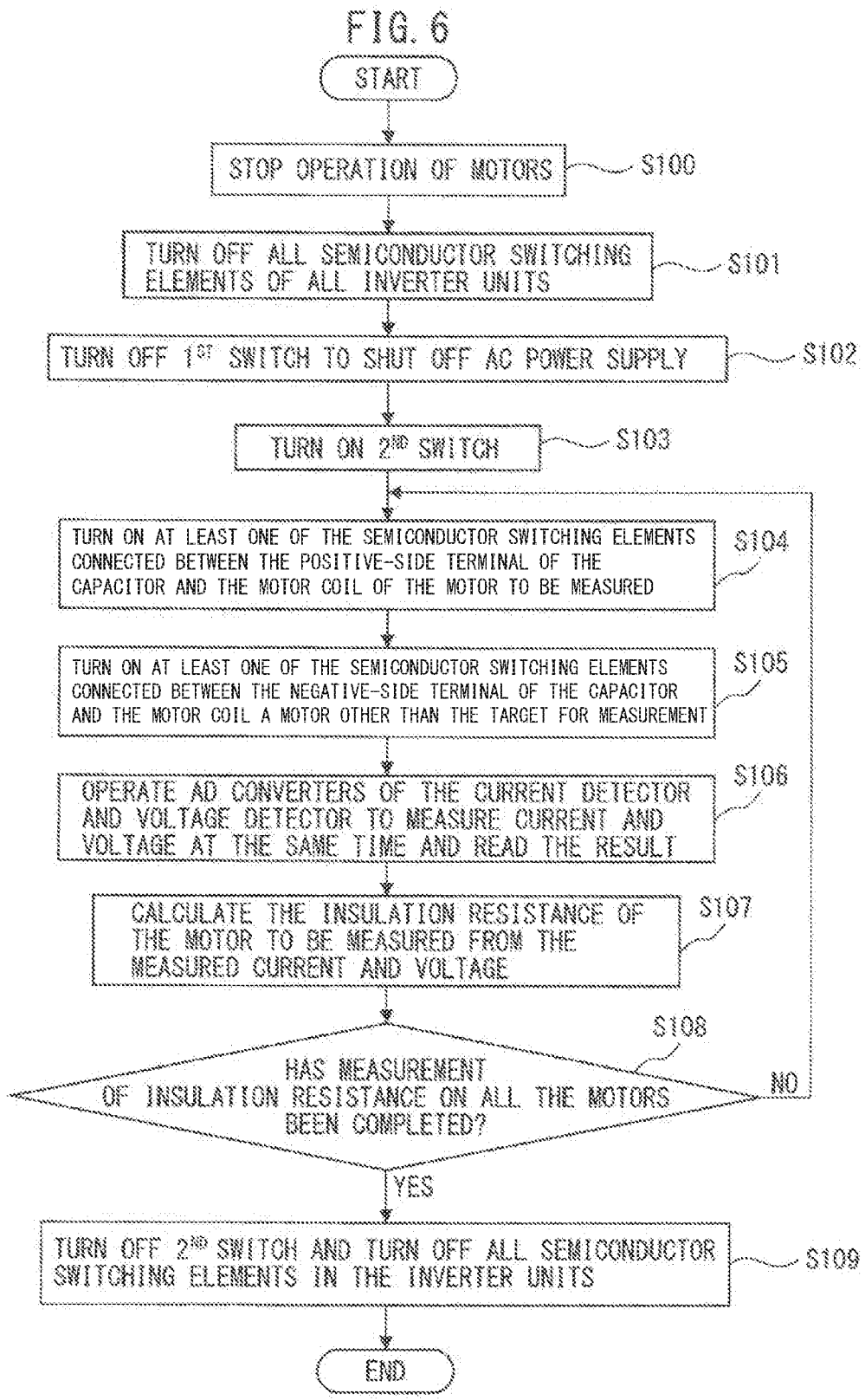
FIG. 6 is a flow chart for explaining the processing steps of an insulation resistance detecting method using a motor drive device according to the first embodiment of the present invention.

Measurement of insulation resistance of the motor is performed in the following manner. FIG. 6 is a flow chart for explaining the processing steps of an insulation resistance detecting method using the motor drive device according to the first embodiment of the present invention. To begin with, at Step S100, the insulation resistance detector 70 stops the operation of all the motors 61 to 63 upon measurement of insulation resistance of motors. At Step S101, the semiconductor switching elements (511 to 561, 512 to 562, 513 to 563) in all the inverter units are turned off. Next, at Step S102, the AC power supply 2 is shut off by turning off the first switch 1. Then, at Step S103, the second switch 9 is turned on so as to connect a first terminal of capacitor 41, i.e., the minus-side terminal 41 of the DC link unit of the power supply unit 4 in the example of FIG. 5, to the earth.

Figure 7:
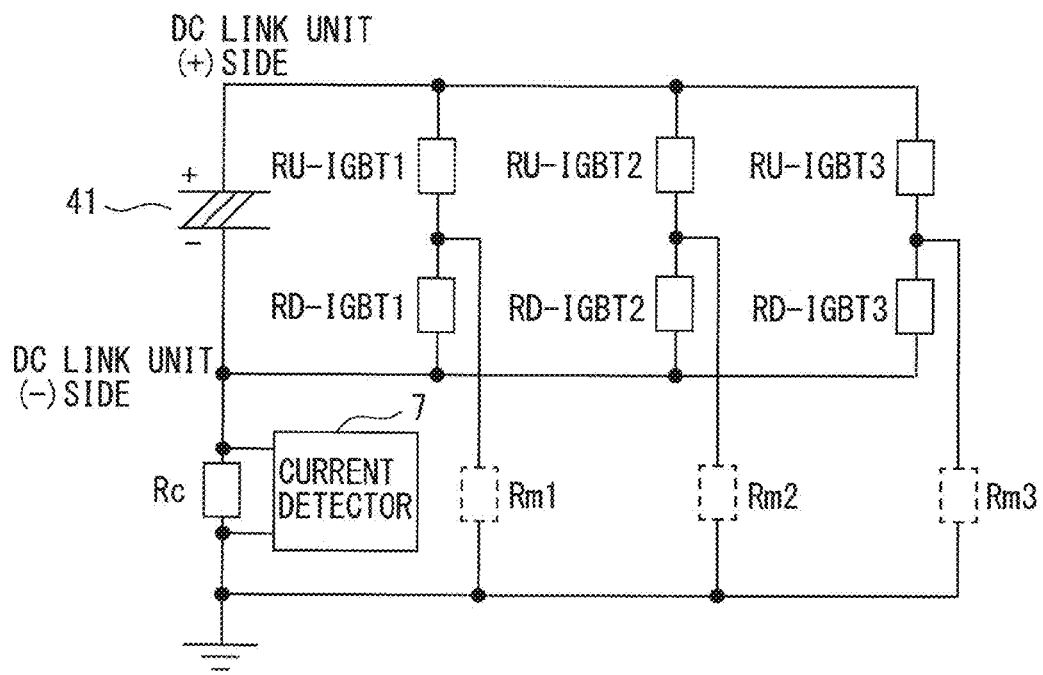
FIG. 7 is a diagram of an equivalent circuit illustrating connection of insulation resistances between IGBTs, motors and the earth in a motor drive device according to the first embodiment of the present invention.

FIG. 7 illustrates an equivalent circuit of the connection of insulation resistances between IGBTs, motors and the earth in the above condition, represented with equivalent insulation resistances for IGBTs. Here, the equivalent insulation resistance for an IGBT is the equivalent insulation resistance of the off-state IGBT between collector and emitter, obtained by dividing the voltage applied between the collector and emitter of the IGBT in its off-state, by the leakage current flowing from the collector to emitter in off-state.

Next, at Step S104, for the inverter unit to which the motor to be measured is connected, among the semiconductor switching elements in either the upper or lower arm, the semiconductor switching element connected between the second terminal of the capacitor and the motor coil of the motor is turned on so that the motor coil of the motor to be measured is set at the same potential with the second terminal of the capacitor.

In the example in FIG. 5, connected to the earth by the second switch 9 is the negative side terminal of capacitor 41, or the DC link unit minus-side terminal 43. Therefore, the IGBTs to be turned on among IGBTs (511 to 561) of the first inverter unit 501 to which the first motor 61 to be measured is connected are those (IGBTs 511, 531, 551) in the upper arm which are connected between the positive-side terminal of capacitor 41 on the opposite side from that connected to the earth via the second switch 9 or the DC link unit plus-side terminal 42 and the motor coil 611-631. The IGBT to be turned on in the first inverter unit 501 may be any of U-, V- and W-phases as long as it is in the upper arm, and either only one IGBT or multiple IGBTs may be turned on. In this case, the IGBT 511 of U-phase in the upper arm alone is set in on-state.

With this arrangement, the motor coils 611 to 631 of the first motor 61 to be measured are set at the same potential with the DC link unit plus-side terminal 42. On the other hand, since the earth is connected to the DC link unit minus-side terminal 43 via the second switch 9, the capacitor 41, the on-state U-phase IGBT 511 in the upper arm of the first inverter unit 501, the insulation resistance between the motor coils 611-631 of the first motor 61 to be measured and the earth, and the current detector 7 form a closed circuit (indicated by the broken line with arrows in FIG. 5).

Next, at Step S105, for the inverter units to which a motor other than the target for measurement is connected, the semiconductor switching elements in either the upper or lower arm, connected between the first terminal of the capacitor and the motor coil, are turned on so that the motor coils of the motors other than the target for measurement are all set at the same potential with the first terminal of the capacitor.

As described above, in the example of FIG. 5, connected to the earth via the second switch 9 is the DC link unit minus-side terminal 43. Accordingly, the IGBTs to be turned on in the second and third inverter units 502 and 503 to which motors other than the motor to be measured are connected, are those in the lower arm connected to the DC link unit minus-side terminal 43. In the second and third inverter units 502 and 503, the IGBT to be turned on may be any of U-, V- and W-phases as long as it is in the lower arm, and either only one IGBT or multiple IGBTs may be turned on. In this case, for the second inverter unit 502 the IGBT 542 of V-phase in the lower arm is turned on while for the third inverter unit 503 the IGBT 563 of W-phase in the lower arm is turned on.

By this arrangement, the potentials of the motor coils (612 to 632, 613 to 633) of the motors other than the target for measurement, namely the second and third motors 62 and 63 become equal to the potential at the DC link unit minus-side terminal 43. Since the DC link unit minus-side terminal 43 is also connected to the earth via the second switch 9, the DC link voltage is not applied between the motor coil (612 to 632, 613 to 633) of the second and third motors 62 and 63 other than the target for measurement and the earth, so that it is possible to eliminate unnecessary current flowing to the current detector 7 via the second and third motors 62 and 63 other than the target for measurement.

In the above way, while for both the inverter unit to which the motor to be measured is connected and the inverter units to which a motor other than the target for measurement is connected, predetermined semiconductor switching elements are turned on, measurement operation is performed such that the current flowing between one terminal of the capacitor and the earth is measured by the current detector while the voltage across the capacitor is measured by the voltage detector.

Figure 8:
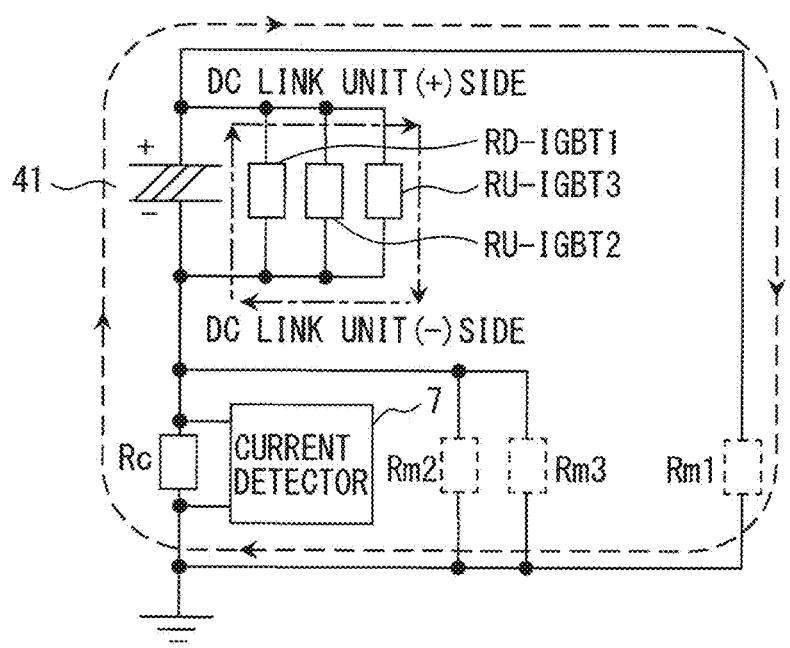
FIG. 8 is an equivalent circuit diagram at the time of measurement in a motor drive device according to the first embodiment of the present invention.

FIG. 8 shows an equivalent circuit of the embodiment of FIG. 5, at the time of measurement. From the state illustrated in FIG. 7, one upper arm IGBT (511) of the first inverter unit 501 turns on while one IGBT (542) and one IGBT (563) in the lower arm in the second and third inverter units turn into on-state. As a result, the equivalent circuit in FIG. 8 becomes equivalent to the circuit of FIG. 7 in which the equivalent insulation resistance RU-IGBT1 of the upper arm IGBT of the first inverter unit 501 and the equivalent insulation resistances RD-IGBT2 and RD-IGBT3 of the lower arm IGBTs of the second and third inverter units 502 and 503 are short-circuited.

In FIGS. 7 and 8, RU-IGBT1, RU-IGBT2 and RU-IGBT3 represent the equivalent insulation resistances of the off-state IGBTs in the upper arm of the first, second and third inverter units 501, 502 and 503, respectively. RD-IGBT1, RD-IGBT2 and RD-IGBT3 represent the equivalent insulation resistances of the off-state IGBTs in the lower arm of the first, second and third inverter units 501, 502 and 503, respectively. Rm1, Rm2 and Rm3 represent the insulation resistances between the earth and the coil of the first motor 61, second motor 62 and third motor 63, respectively. Rc represents a series of the voltage dividing resistance of the current detector 7 and the current detection resistance as a single resistance.

In the case of a three-phase inverter for driving a three-phase motor as illustrated in FIG. 5, one inverter unit includes three semiconductor switching elements (IGBTs) in each of the upper and lower arms. The three IGBTs of the upper arm as well as those of the lower arm in one inverter are arranged in parallel with their collector terminals joined together with the DC link unit and their emitter terminals joined via the motor coils inside the motor. For this reason, three IGBTs in the upper arm or in the lower arm in each inverter can be represented as a single combined resistance, as in the equivalent circuits in FIGS. 7 and 8.

As apparent from the equivalent circuit in FIG. 8, all the off-state IGBTs, specifically, the IGBTs in the lower arm of the first inverter unit 501 and in the upper arm of the second and third inverter units 502 and 503, represented by the equivalent insulation resistances RD-IGBT1, RU-IGBT2 and RU-IGBT3, are directly connected between the plus-side terminal and the minus-side terminal of the DC link unit. The currents though these off-state IGBTs flow directly from the plus-side terminal to the minus-side terminal of the DC link unit without going through current detector 7. As a result, it is understood that no influence will be given to the measurement of insulation resistance Rm1 of the first motor 61 to be measured. Accordingly, these off-state IGBTs can be regarded as being none in measurement.

On the other hand, the insulation resistances of the motors other than the target for measurement, specifically, the insulation resistances Rm2 and Rm3 between the motor coil of the second and third motors 62 and 63 and the earth, are connected in parallel with current detector 7. However, as long as the resistance Rc of current detector 7 is sufficiently low compared to the insulation resistance between the motor coil and the earth (1 [MΩ] or above), the influence on current measurement can be neglected. As a result, the insulation resistances of the motors other than the target for measurement can also be regarded as being none in measurement.

Figure 9:
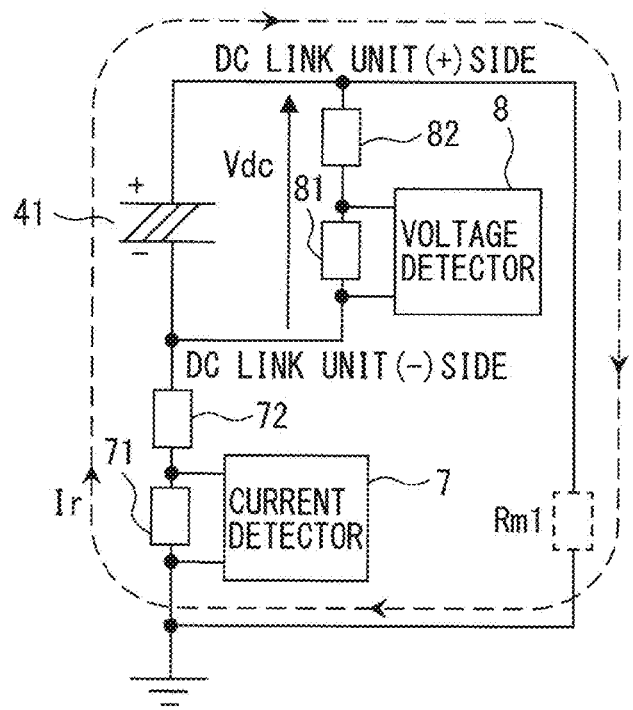
FIG. 9 is a diagram of an equivalent circuit in a motor drive device according to the first embodiment of the present invention, drawn by deleting the part irrelevant to the measurement of insulation resistance of the first motor to be measured, from the equivalent circuit in FIG. 8.

When the part irrelevant to the measurement of insulation resistance of the first motor 61 to be measured is removed from the equivalent circuit of FIG. 8 while the current detector 7 and voltage detector 8 are illustrated with their detection resistance and voltage dividing resistance as in the FIG. 5, an equivalent circuit shown in FIG. 9 is obtained.

The equivalent circuit at the time of measurement is reduced to a simple circuit of a single closed circuit of the capacitor 41 to which the insulation resistance Rm1 of the first motor and a series of detection resistance 71 and voltage dividing resistance 72 of the current detector 7 are connected, as in FIG. 9.

Since the resistance values of detection resistance 71 and voltage dividing resistance 72 are known, when the voltage Vdc across the capacitor 41 is measured by the voltage detector 8 and the current Ir flowing through the detection resistance 71 is measured by the current detector 7, it is possible to easily determine the Rm1 to be found, by calculation using Vdc and Ir obtained by measurement, as apparent from FIG. 9.

Figure 10:
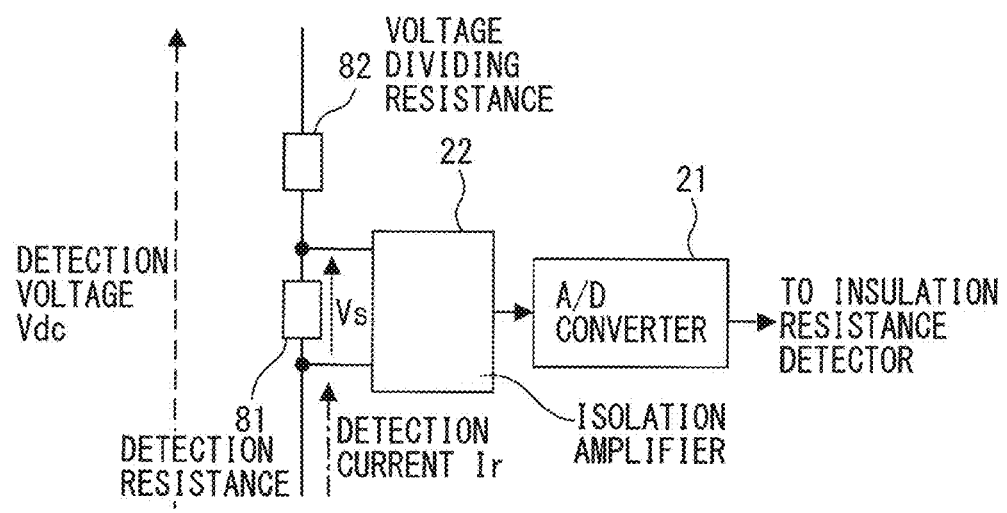
FIG. 10 is a specific configurational diagram of a measuring circuit of a voltage detector and a measuring circuit of a current detector, in a motor drive device according to the first embodiment of the present invention.

FIG. 10 depicts a specific configurational example of a measuring circuit of the voltage detector 8 for measuring the voltage across the capacitor 41 and a measuring circuit of the current detector 7 for measuring the current flowing between one terminal of the capacitor 41 and the earth when the second switch 2 is turned on.

Either of the current detector 7 and the voltage detector 8 is a circuit for measuring voltage between the terminals of a detection resistance. However, since the resistance value of the detection resistance and the voltage dividing resistance are known, the current detector 7 uses this circuit as a current measuring circuit for determining the current flowing through the detection resistance from the measurement result, whereas the voltage detector 8 uses the same circuit as a voltage detecting circuit for determining the voltage across the series of the voltage dividing resistance and the detection resistance from the division ratio of the resistances.

Here, either of the detection resistances in the circuits of the voltage detector 8 and the current detector 7 is connected to the primary side, so that an isolation amplifier is used to convert the voltage across the detection resistance into the secondary potential to be the detection voltage, which in turn is supplied to an AD converter 21 to be converted into a digital value (Step S106).

The AD converter 21 performs AD conversion at the time when receiving instructions from insulation resistance detector 70. The current value and voltage value converted in the digital value are read by insulation resistance detector 70, and used to calculate the insulation resistance of the motor to be measured by the operation at insulation resistance detector 70.

As described above, since the present invention provides such a connection structure that the currents flowing through the off-state semiconductor switching elements will not flow into the current detector at the time of measurement, it is possible to perform exact measurement free from influence of the off-state semiconductor switching elements; this is the greatest feature of the invention.

In the example in FIG. 5, the negative side terminal of capacitor 41, i.e., the DC link unit minus-side terminal 43 is connected to the earth via the second switch 9. Therefore, measurement is performed in the condition that the upper IGBTs are turned on in the inverter to which the motor to be measured is connected while the lower arm IGBTs are turned on in the inverters to which a motor other than the target for measurement is connected.

In contrast to the example of FIG. 5, the positive side terminal of capacitor 41, i.e., the DC link unit plus-side terminal 42 may be connected to the earth via the second switch 9. However, in this case, measurement is performed in a manner opposite to that in the example of FIG. 5, or in the condition that the lower arm IGBTs are turned on in the inverter to which the motor to be measured is connected while the upper arm IGBTs are turned on in the inverters to which a motor other than the target for measurement is connected.

Though description heretofore has been made by taking the example in which the target for measurement is only a single motor, a plurality of motors may be selected as the target for measurement so that the plural target motors may be measured at the same time. In this case, obtained as the measurement result is the combined resistance when the insulation resistances of the plural target motors, measured at the same time, are connected in parallel.

Specifically, in the example of FIG. 5, when two motors, the first and third motors 61 and 63, are selected as the target for measurement and measured at the same time, measurement is performed in the condition that the upper arm IGBTs o in the first and third inverters 501 and 503 are turned on while only the lower arm IGBTs in the second inverter unit 502 are turned on. By this measurement, the combined resistance of the insulation resistance of the first motor 61 and that of the third motor 63 being connected in parallel is obtained as the measurement result.

After the measurement, the second switch 9 is turned off and all the IGBTs in every inverter are turned off (Step S109).

In the present embodiment, for not only the inverter to which the motor to be measured is connected at the time of measurement, but also for the inverters to which a motor other than the target for measurement is connected, at least one of plural semiconductor switching elements is turned on. This is done because not only for the motor to be measured but also for the motors other than the target for measurement, at least one phase terminal of the motor coils may be connected to one of the plus-side terminal and minus-side terminal of the DC link unit.

Accordingly, in the case of a multi-level inverter to which a plurality of semiconductor switching elements are connected in series between one side of the DC link unit and the motor coil, all the plural semiconductor switching elements connected in series between the one side of the DC link unit and the motor coil may and should be turned on.

All the procedures of measuring insulation resistance of motors described above are carried out by the insulation resistance detector 70 of motor drive device 101. In the embodiment of FIG. 5, the "insulation resistance detector" 70 is implemented by a microcomputer. That is, the microcomputer gives instructions at exact timing in accordance with the flowchart in the example of FIG. 6 so as to perform necessary processing for measurement such as instructions of on/off operation of the semiconductor switching elements of every inverter unit, on/off operation of the first and second switches 1 and 9, AD conversion by the AD converters 21 for the voltage detector 8 and current detector 7, loading of converted data, calculation of the insulation resistance of the motor to be measured, and the like.

Where there are multiple motors to be measured, it is determined at Step S108 whether measurement of insulation resistance on all the motors has been completed. If measurement of insulation resistance on all the motors as the targets for measurement has not been completed, the control returns to Step S104 to continue measurement of insulation resistance of another motor to be measured. On the other hand, when measurement of insulation resistance on all the motors to be measured has been completed, the second switch 9 is turned into off-state and all the semiconductor switching elements in every inverter are turned into off-state at Step S109.

Execution of the above sequence of procedures makes it possible to detect the insulation resistances to be measured.

When the insulation resistances of all the motors are measured by switching the motors to be measured, the processing from Steps S104 to S107 is repeated for every switching of the motor to be measured from one to another until measurement of insulation resistance on all the motors is completed as illustrated in FIG. 6, and then, after completing measurement of the last motor the control proceeds from Step S107 to S108 to end measurement. In this way, it is possible to carry out measurement of insulation resistance on all motors.

Alternatively, the processing from Steps S104 to S106 may repeated for every switching of motors to be measured by storing the measurement result, i.e., the current value and voltage value for each motor into insulation resistance detector 70, and then the insulation resistance values of the multiple motors may be calculated at once at the insulation resistance detector.

In the flow chart of FIG. 6, Steps S104 and S105 are processed simultaneously, or the procedures of Steps S104 and S105 may be changed in order.

Second Embodiment

Figure 11:
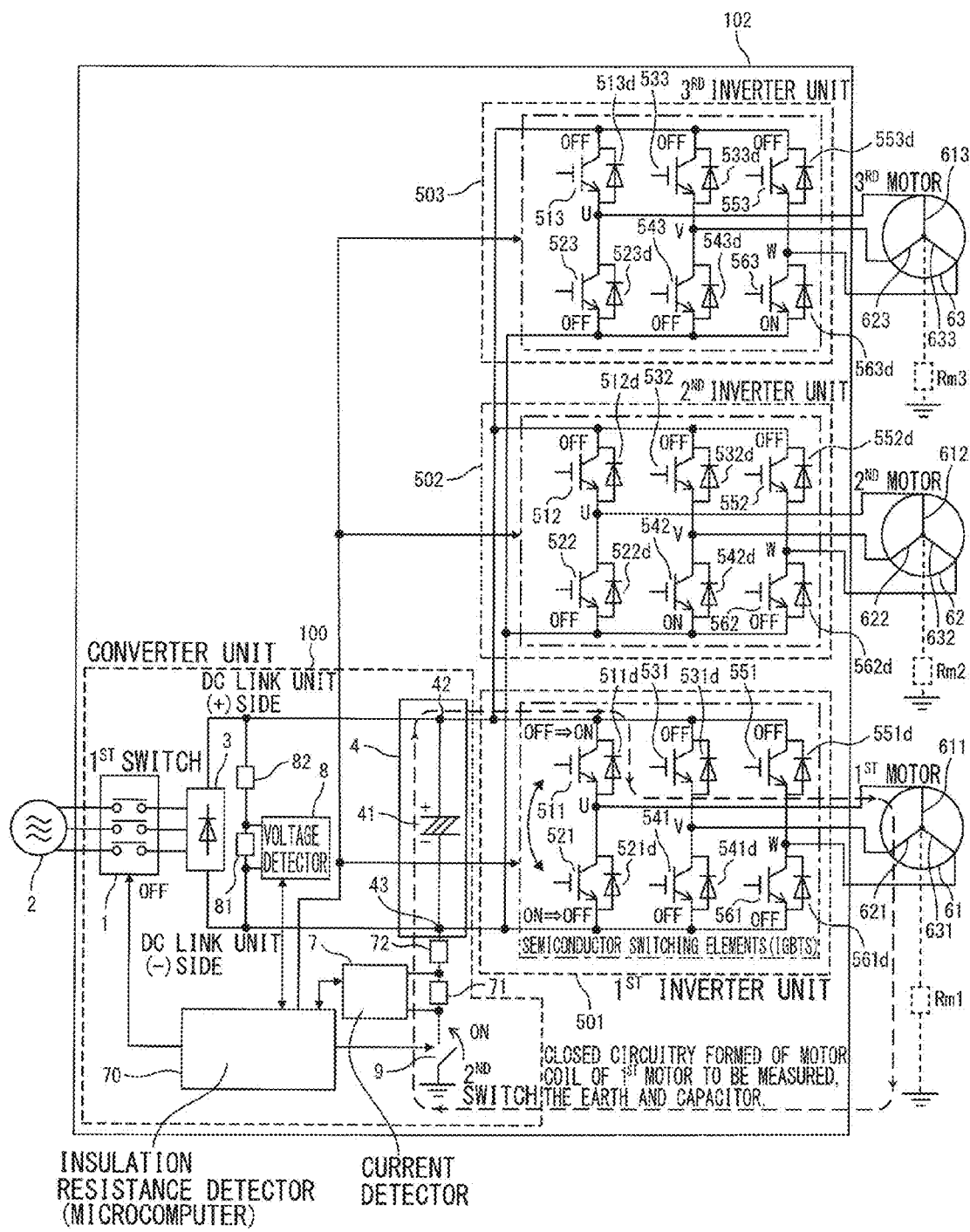
FIG. 11 is a configurational diagram of a motor drive device including an insulation resistance detector, according to the second embodiment of the present invention.

Next, a motor drive device according to a second embodiment of the present invention will be described. FIG. 11 is a configurational diagram of a motor drive device including an insulation resistance detector according to the second embodiment of the present invention.

A motor drive device 102 according to the second embodiment of the present invention includes: a converter unit 100 having a rectifier circuit 3 configured to rectify AC voltage supplied from an AC power supply 2 via a first switch 1 into DC voltage; a power supply unit 4 configured to smooth the DC voltage rectified by the rectifier circuit 3 through a capacitor 41; a plurality of inverter units 501 to 503 that convert the DC voltage from the power supply unit 4 to AC voltage to drive multiple motors 61 to 63, respectively, by switching operation of the semiconductor switching elements in an upper arm, connected between the positive-side terminal of the capacitor 41, i.e., the DC link unit plus-side terminal 42 and a motor coil as well as the semiconductor switching elements in a lower arm, connected between a negative-side terminal of the capacitor 41, i.e., the DC link unit minus-side terminal 42 and the motor coil; a second switch 9 that connects the negative-side terminal of the capacitor 41 or the DC link unit minus-side terminal 43 to the earth; a current detector 7 configured to measure the current flowing between a first terminal of the capacitor 41 and the earth; a voltage detector 8 configured to measure voltage between both ends of the capacitor 41; an insulation resistance detector 70 configured to detect insulation resistance of each of multiple motors 61 to 63 respectively driven by the plurality of inverter units 501 to 503. The motor drive device is characterized in that the drive circuit of semiconductor switching elements in the upper arm is formed of a bootstrap circuit, the insulation resistance detector 70 detects the insulation resistance of the motor to be measured based on the measured current and voltage in the condition that operation of the motors 61 to 63 is stopped, the first switch 1 is turned off, the second switch 9 is turned on, switching operation is performed for groups of semiconductor switching elements in the upper and lower arms to which the coil of the motor to be measured is connected, by turning on and off the group of semiconductor switching elements in the upper arm and the group of semiconductor switching elements in the lower arm, alternately, so as to charge the bootstrap circuits in the upper arm when the semiconductor switching elements in the lower arm are in on-state, and the semiconductor switching elements in the lower arm of the inverter units to which a motor other than the motor to be measured is connected are turned on.

The motor drive device 102 according to the second embodiment is the same as the motor drive device of the first embodiment illustrated in FIG. 5 in that first, second and third inverter units 501, 502 and 503 for respectively driving first, second and third motors 61, 62 and 63 are connected to the single power supply unit 4, and Rm1, Rm2 and Rm3 are insulation resistances between the earth, and the motor coils of the first motor 61, the second motor 62, the third motor 63, respectively. The motor drive device 102 of the second embodiment is different from the motor drive device 101 of the first embodiment illustrated in FIG. 5 in that the drive circuit of a semiconductor switching element (IGBT) in the upper arm of each inverter is formed of a bootstrap circuit.

Figure 12:
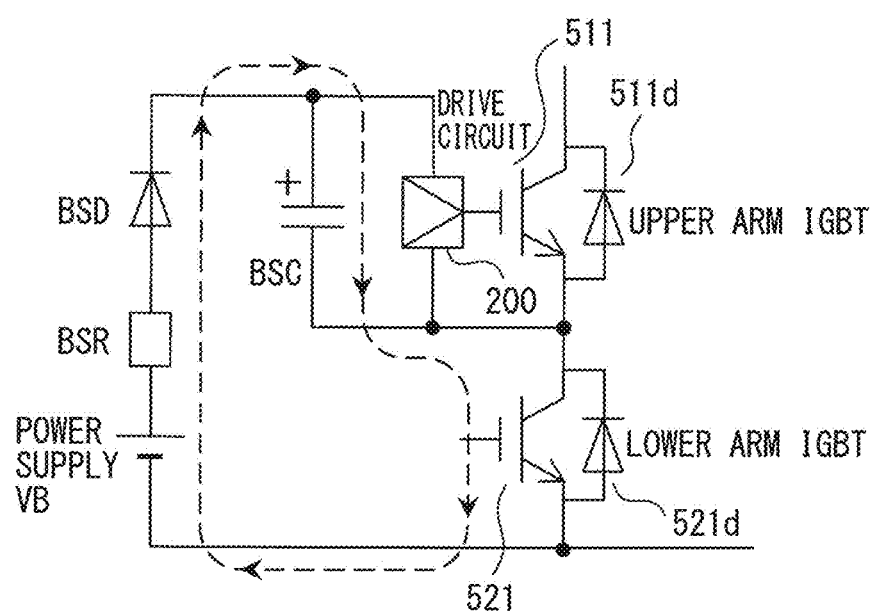
FIG. 12 is a configurational diagram of a bootstrap circuit in a motor drive device according to the second embodiment of the present invention.

FIG. 12 presents one example of a bootstrap circuit. The bootstrap circuit is a circuit formed of a power supply VB, a resistance BSR, a diode BSD and a capacitor BSC, in which the capacitor BSC is used as a power supply for the drive circuit of an upper arm IGBT. The part of the bootstrap circuit in FIG. 12, specifically, the power supply VB, BSR, BSD, BSC and the drive circuit in FIG. 12 are omitted in FIG. 11. In addition, the pair of the upper arm IGBT and the lower arm IGBT in FIG. 12 corresponds to each of 511 and 521, 531 and 541, 551 and 561 in the first inverter unit 501, 512 and 522, 532 and 542, 542 and 562 in the second inverter unit 502, 513 and 523, 533 and 543, 553 and 563.

Accordingly, in the case of the bootstrap circuit, in order to set the IGBT in the upper arm into on-state, the capacitor BSC has to be charged by the voltage corresponding to the power supply VB by turning on the lower arm IGBT beforehand to produce a current flowing along the path indicated by the broken line with arrows in FIG. 12. Further, since the power supply to the upper arm IGBT drive circuit is the capacitor BSC, its capacity for current supply is limited so that it is only possible for the upper arm IGBT to continue on-state for a period in which energy charged in the capacitor BSC can drive.

Similarly to the description with regard to FIG. 5, the motor drive device according to the embodiment illustrated in FIG. 11 will be described by referring a case where among three motors, i.e., first motor 61, second motor 62 and third motor 63 the first motor 61 is selected as the motor to be measured, to measure the insulation resistance of the first motor 61.

In measuring insulation resistance of motors, the insulation resistance detector 70 stops the operation of all the motors 61 to 63 and turns off all the semiconductor switching elements. Then, after shutting off the AC power supply 2 by turning off the first switch 1, the second switch 9 is turned on so as to connect the negative-side terminal of the capacitor 41, i.e., the DC link unit minus-side terminal 43 to the earth. The operation heretofore is the same as that explained for the motor drive device according to the first embodiment with reference to FIG. 5.

Here, in the case of an inverter in which the drive circuit of the upper arm semiconductor switching element is formed of a bootstrap circuit, the terminal to be connected to the earth via the second switch 9 needs to be the DC link unit minus-side terminal 43.

This is reasoned as follows. First, for the inverters to which a motor other than the target for measurement is connected, the semiconductor switching element electrically connected to one end of the capacitor that is connected to the earth via the second switch 9, has to be kept on in order to perform measurement. However, in the case of the bootstrap circuit, it is impossible to keep the upper arm semiconductor switching element in on-state for long time. Accordingly, the inverters to which a motor other than the target for measurement is connected have to perform such an operation as to turn on the lower arm that can keep on-state for long time. This is why the negative-side terminal of the capacitor 41 connected to the lower arm semiconductor switching element, or the DC link unit minus-side terminal 43 is connected to the earth via the second switch 9.

For the inverter unit to which the motor to be measured is connected, among the plural pairs of upper and lower arm semiconductor switching elements, at least one pair of the switching elements is subjected to switching operation of repeatedly turning on and off the upper arm and the lower arm alternately by use of a PWM signal with a fixed duty ratio. In this way, while the lower arm semiconductor switching element is in on-state, the capacitor BSC of the bootstrap circuit of the upper arm is charged.

In the example of FIG. 11, as to the IGBTs of the first inverter unit 501 to which the motor 61 to be measured is connected, the U-phase upper arm IGBT 511 is set into off-state and the U-phase lower arm IGBT 521 is set into on-state. Then, the upper arm U-phase IGBT 511 is set into on-state and the U-phase lower arm IGBT 521 is set into off-state. This switching operation is alternately repeated by a PWM signal with a duty ratio of 50%.

Herein, the pair of IGBTs for which the switching operation of alternately turning on and off the upper and lower arms is performed may be any pair of IGBTs among U-phase, V-phase and W-phase pairs. Further, either only one pair or plural pairs may be subjected to the switching operation. Herein, switching is performed for only one pair, i.e., the U-phase pair of IGBTs in the upper and lower arms.

In the switching operation of U-phase IGBTs in this first inverter unit 501, when the upper arm IGBT 511 is turned on in a duty ratio of 50%, the motor coil of the first motor 61 to be measured is set at the same potential with the DC link unit plus-side terminal 42. On the other hand, since the DC link unit minus-side terminal 43 is connected to the earth via the second switch 9, a closed circuit passing insulation resistance Rm1 between the motor coils 611 to 631 of the first motor 61 to be measured and the earth and detection resistance 71 of the current detector 7 is formed (indicated by the broken line with arrows in FIG. 11).

When the lower arm IGBT 521 is turned on in a duty ratio of 50%, the motor coils of the first motor 61 to be measured are set at the same potential with the DC link unit minus-side terminal 43. Further, since the DC link unit minus-side terminal 43 is connected to the earth via the second switch 9, the capacitor 41's voltage across the DC link is not applied between the motor coils 611 to 631 of the first motor 61 to be measured and the earth. However, the bootstrap circuit operates so that the capacitor in the bootstrap circuit, which will work as the power supply for the drive circuit of the upper arm IGBT, is charged as has been already described with reference to FIG. 12.

As to the inverter units to which a motor other than the target for measurement is connected, at least, one semiconductor switching element in the lower arm is set into on-state so that the motor coils of the motors other than the target for measurement are all set equal to the potential of the negative-side terminal of the capacitor, i.e., the DC link unit minus-side terminal 43, as described in the embodiment of FIG. 5.

The IGBTs to be turned on in the second and third inverter units 502 and 503 to which a motor other than the target for measurement is connected may be any IGBT of U-, V- and W-phases as long as they are in the lower arm, and either only one IGBT or a plurality of IGBTs may be turned on. In the example of FIG. 11, similarly to the example of FIG. 5, for the second inverter unit 502 the V-phase IGBT 542 in the lower arm is turned on while for the third inverter unit 503 the W-phase IGBT 563 in the lower arm is turned on.

By this arrangement, the potentials of the motor coils of the second and third motors 62 and 63 other than the target for measurement become equal to the potential at the DC link unit minus-side terminal 43. Therefore, the DC link voltage is not applied to the motor coils of the second and third motors 62 and 63 other than the target for measurement, so that it is possible to eliminate currents flowing to the current detector 7 via the second and third motors 62 and 63 other than the target for measurement. This situation is the same as has been described with FIG. 5.

As has been described heretofore, for the inverter to which the motor to be measured is connected, at least one pair of serially connected upper and lower arm semiconductor switching elements are switched on and off in an alternate manner by use of a PWM signal of pulses repeating in a fixed duty ratio. On one hand, for the inverters to which a motor other than the target for measurement is connected, while the lower arm semiconductor switching elements are kept in on-state, the current detector 7 measures the current flowing between one end of the capacitor and the earth, and at the same time voltage detector 8 measures the voltage across the capacitor so as to thereby perform a measuring operation.

In this case, the equivalent circuit when the upper arm IGBTs (511, 531, 551) in the first inverter unit 501 to which the first motor 61 to be measured is connected are being set in on-state for 50% of the duty cycle time is the same as FIGS. 8 and 9. Accordingly, it is possible to calculate the insulation resistance of the motor 61 to be measured from the current and voltage obtained from measurement, by making the current detector 7 measure the current flowing between one end of the capacitor 41 and the earth and making detector 8 measure the voltage across the capacitor 41 at the time in cooperation with respective AD converters (not illustrated) when the upper arm IGBTs (511, 531, 551) in the first inverter unit 501 are being in on-state. This aspect is the same as described above with reference to FIG. 9.

The upper arm IGBT in the inverter to which the motor to be measured is connected is repeatedly switched on and off by a PWM signal of a fixed duty ratio. Therefore, the average voltage to be applied between the coils of the motor to be measured and the earth is the value obtained by multiplying the voltage across the capacitor by the duty ratio, e.g., 50% in the example of FIG. 11. Accordingly, 50% of the voltage across the capacitor can be regarded as the average of the voltage applied between the motor coils of the first motor 61 and the DC link unit minus-side terminal 43.

Taking advantage of this, the current flowing through current detector 7 can be determined as follows. That is, in the current detector 7, AD conversion is performed at a sampling frequency sufficiently high compared to the frequency of the PWM signal. Then, based on the average current value obtained by leveling off the the sampled data for every sampling and the average value of the applied voltage obtained by multiplying the voltage across the capacitor by the duty ratio, the insulation resistance of the motor to be measured is determined.

All the procedures of measuring insulation resistance of motors described above are carried out by insulation resistance detector 70 of the motor drive device. Also in the example of FIG. 11, similarly to the example of FIG. 5, the "insulation resistance detector" 70 is embodied by a microcomputer. The microcomputer instructs at appropriate timing so as to perform necessary processing for measurement such as instructions of the operation by the PWM signal of switching the semiconductor switching elements of the inverter to which the motor to be measured is connected, on/off operation of the semiconductor switching elements of every inverter unit, on/off operation of the first and second switches 1 and 9, AD conversion by the AD converters for the voltage detector 8 and current detector 7, loading of converted data, calculation of the insulation resistance of the motor to be measured, and the like.

Also in the example of FIG. 11, the specific configurations of the measuring circuit of the voltage detector 8 for measuring the voltage across the capacitor and the measuring circuit of the current detector 7 of measuring the current between one end of capacitor 41 and the earth when the second switch 9 is turned on, can use that illustrated in FIG. 10.

Third Embodiment

Next, a motor drive device according to a third embodiment of the present invention will be described. The configuration of the motor drive device of the third embodiment is the same as that of the motor drive device according to the first embodiment.

A motor drive device according to the third embodiment of the present invention includes: a converter unit 100 having a rectifier circuit 3 configured to rectify AC voltage supplied from an AC power supply 2 via a first switch 1 into DC voltage; a power supply unit 4 configured to smooth the DC voltage rectified by the rectifier circuit 3 through a capacitor 41; a plurality of inverter units 501 to 503 configured to convert the DC voltage from the power supply unit 4 to AC voltage to drive multiple motors 61 to 63, respectively, by switching operation of the semiconductor switching elements in an upper arm, connected between a positive-side terminal of the capacitor 41, i.e., the DC link unit plus-side terminal 42 and a motor coil, as well as the semiconductor switching elements in a lower arm, connected between a negative-side terminal of the capacitor 41, i.e., the DC link unit minus-side terminal 42 and the motor coil; a second switch 9 configured to connect one terminal of the capacitor 41 to the earth; a current detector 7 configured to measure current flowing between the one terminal of the capacitor 41 and the earth; a voltage detector 8 configured to measure voltage between both ends of the capacitor 41; an insulation resistance detector 70 configured to detect insulation resistance of each of the multiple motors 61 to 63 driven by the plurality of inverter units 501 to 503, and is characterized in that the insulation resistance detector 70 determines combined resistance of the insulation resistance of all the motors from the measured current value by the current detector 7 and the measured voltage value by the voltage detector in a condition that operation of the motors 61 to 63 is stopped, the first switch 1 is turned off, the second switch 9 is turned on, and semiconductor switching elements connected between the other terminal of the capacitor and the motor coil among the semiconductor switching elements in either the upper or lower arm in all the inverter units is turned on.

When the combined resistance is equal to or higher than a reference value, the insulation resistance detector determines insulation resistance of the motor selected as a target for measurement from the measured current by the current detector 7 and the measured voltage by the voltage detector 8 in a condition that semiconductor switching elements connected between the other terminal of the capacitor and the motor coil among the semiconductor switching elements in either the upper or lower arm of the inverter unit to which an arbitral motor selected as a target for measurement is connected are turned on, and the semiconductor switching elements connected between the one terminal of the capacitor and the motor coil among the semiconductor switching elements in either the upper or lower arm of the inverter units to which a motor other than the motor to be measured is connected are turned on.

When the combined resistance value is lower than the reference value, the insulation resistance detector determines insulation resistance of the motor selected as a target for measurement from the measured current by the current detector 7 and the measured voltage by the voltage detector 8 in a condition that the semiconductor switching elements connected between the other terminal of the capacitor and the motor coil among the semiconductor switching elements in either the upper or lower arm of the inverter unit to which an arbitral motor selected as a target for measurement is connected are turned on, and all the semiconductor switching elements of the inverter units to which a motor other than the motor to be measured is connected are turned off.

Insulation degradation of motors is a phenomenon that the insulation resistance between the motor coil and the earth gradually lowers over time in, for example a machine tool motor, etc., that is used under an environment where the motor is constantly exposed to cutting fluids, due to slow penetration of the cutting fluids into the interior of the motor.

On the other hand, there are cases where the insulation resistance between the motor coil and the earth becomes extremely low (e.g., some ohms) such as a case where the motor coil and the motor case have become short-circuited inside the motor for some unspecified reason, a case where the cover of the power cable that connects between the motor coil and the inverter was broken in the state of the motor being assembled in the machine so that the power cable and the earth have become short-circuited, and other cases. This condition is called "ground fault" and distinguished from "insulation degradation".

The inventions according to Embodiments 1 and 2 having been described heretofore can achieve high-accuracy measurement in measuring insulation resistance at such levels as to detect insulation degradation of motors. However, if the motors other than the target for measurement include a motor with an extremely low insulation resistance such as a ground-faulted motor or the like, exact measurement may be difficult.

The reason is that, as has been described using the above equivalent circuit illustrated in FIG. 8, in the inventions according to Embodiments 1 and 2, the insulation resistances of the motors other than the target for measurement behave as being connected in parallel with the current detector. In other words, if the insulation resistances of the motors other than the target for measurement all have high values to some extent and are sufficiently high compared to the resistance of the current detector, high-accuracy measurement can be achieved, but when a motor other than the target for measurement is "ground-faulted", hence has extremely low insulation resistance, this condition cannot be satisfied.

To deal with, in the invention according to the third embodiment, the motor drive device including a plurality of inverter units for driving multiple motors, starts operation with measurement for checking whether a ground-faulted motor is included in the multiple motors connected to the motor drive device.

Specifically, the insulation resistance detector 70 handles all the motors connected to the motor drive device as the target for measurement, measures the insulation resistance of all the motors collectively at the same time.

Figure 13:
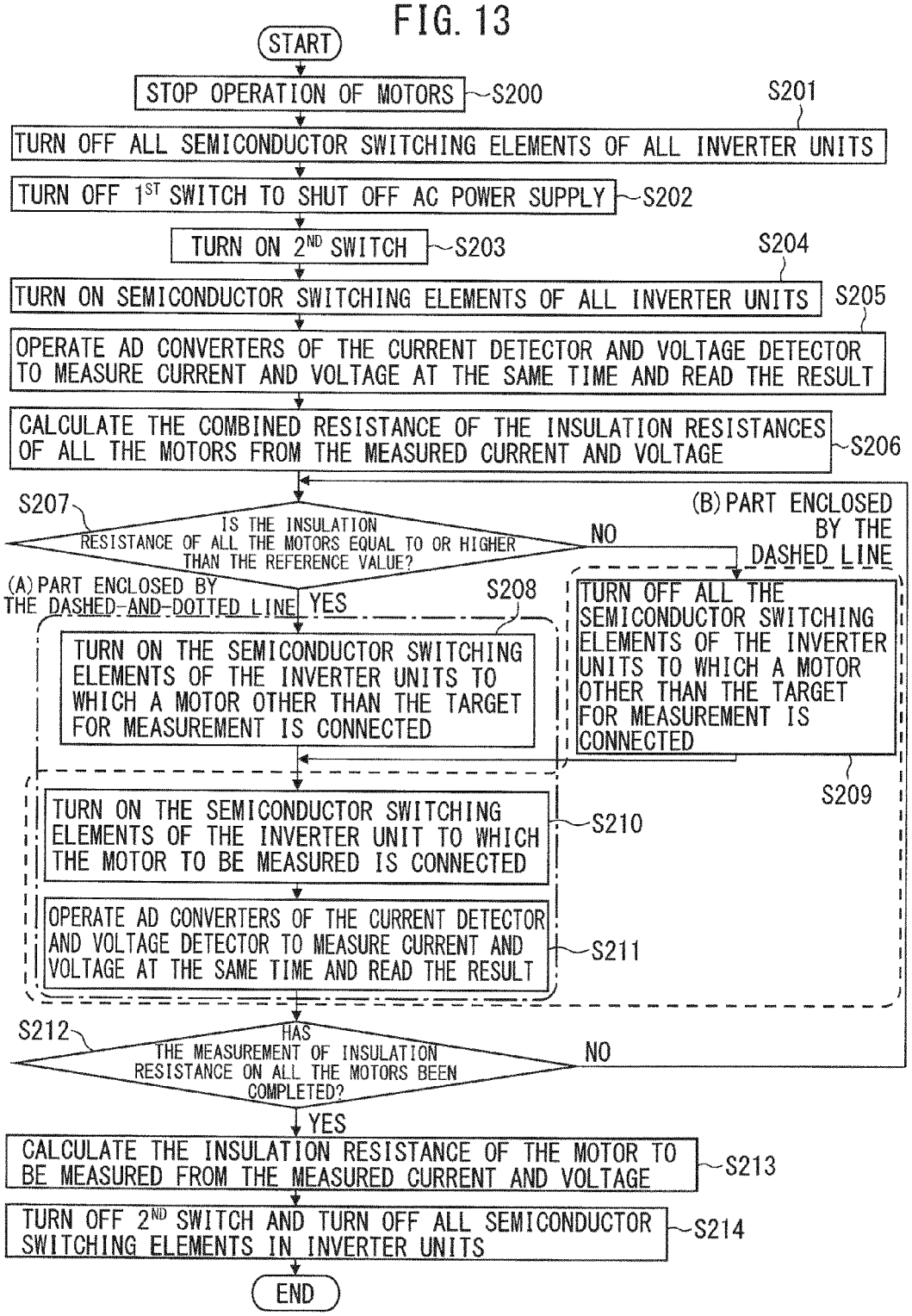
FIG. 13 is a flow chart for explaining the processing steps of an insulation resistance detecting method using a motor drive device according to the third embodiment of the present invention; and, FIG. 14 is a flow chart for explaining the processing steps of an insulation resistance detecting method using a motor drive device according to the fourth embodiment of the present invention.

FIG. 13 is a flow chart for explaining the procedures of an insulation degradation detecting process using the motor drive device according to the third embodiment of the present invention. In the above example illustrated in FIG. 5, at first the operation of the motors is stopped at Step S200. Then, at Step S201, all the semiconductor switching elements of the inverters are turned off. Next, at Step S202, the first switch 1 is turned off to shut off the AC power supply. Then, at Step 203 the second switch 9 is set into on-state. In this state, at Step S204 at least one of the IGBTs as the upper arm semiconductor switching elements of all the inverter units, i.e., the first inverter unit 501, second inverter unit 502 and third inverter unit 503, is turned on. Next, at S205 current is measured by the current detector 7 and voltage is measured by the voltage detector 8. Then, at Step S206, the combined resistance of the insulation resistances of all the motors is calculated from the obtained current and voltage.

The result obtained herein by measuring all the motors as the target for measurement is given as the combined resistance of the insulation resistances of all the motors connected in parallel. In the example of FIG. 5, this corresponds to the combined resistance of Rm1, Rm2 and Rm3 connected in parallel.

Accordingly, if the measured value of the insulation resistance obtained by measuring all the motors as the target for measurement is sufficiently higher than the insulation resistance at the 'ground fault' level, it is determined that there is no ground-faulted motor among all the motors connected to the motor drive device. On the contrary, when the measured value of insulation resistance is not higher than the ground fault level, it is determined that a ground-faulted motor is included in the multiple motors connected to the motor drive device.

Next, as will be described hereinbelow, an arbitrary motor is selected as a target for measurement from the multiple motors so as to measure the insulation resistance of the selected specific motor. Upon this, at Step S207 the insulation resistance detector 70 performs measurement by selecting the optimal method depending on whether the preceding measurement of the combined resistance of the insulation resistances of all the motors is equal to or higher than the reference value or lower than the reference lever.

Descriptions will be given for two different cases.

(A) A case where the combined resistance of the insulation resistances of all the motors is equal to or higher than the reference value:—

In this case, since it can be determined that there is no ground-faulted motor that is extremely low in insulation resistance, at Step S208 by turning on the semiconductor switching elements of the inverters to which a motor other than the target for measurement is connected, exact measurement of insulation resistance is performed in accordance with the invention of the first embodiment or the second embodiment. Since the specific example of the measurement in the case of (A) has been already described with reference to FIG. 5, detailed description is omitted.

(B) A case where the combined resistance of the insulation resistances of all the motors is lower than the reference value:—

In this case, since it can be determined that a motor such as a ground-faulted motor or the like that is extremely low in insulation resistance is included, the following method is used to measure insulation resistance.

Specifically, while the motors are stopped with the first switch 1 off and the second switch 2 on, the semiconductor switching elements of the inverters to which a motor other than the target for measurement is connected, are all turned off at Step S209. Next, at Step S210, among the semiconductor switching elements of either the upper or lower arm of the inverter to which an arbitrary motor selected as the target for measurement is connected, the semiconductor switching element connected between the second terminal of the capacitor and the motor coil is set into on-state. Then, at Step S211, the current detector 7 measures current and the voltage detector measures voltage. From the thus measured current and voltage, the insulation resistance of the motor selected as the target for measurement is determined. Either of Steps S210 and S209 may be done first or these steps may be done simultaneously.

In the example depicted in FIG. 5, while the operation of all the motors is stopped with the first switch 1 off and the second switch 9 on, U-phase upper arm IGBT 511 of the first inverter unit 501 to which the first motor 61 as the target for measurement is connected is turned on, and all the IGBTs of the second and third inverter units 502 and 503 to which motors other than the target for measurement, i.e., motors 62 and 63, are respectively connected, are turned off. In this condition, the current detector 7 measures current and voltage detector 8 measure voltage at the same time, and from the obtained current and voltage, the insulation resistance of the motor selected as the target for measurement is determined.

In the above method (A), even when each motor has a high insulation resistance, it is possible to perform exact measurement without being affected by the leakage currents flowing through the semiconductor switching elements. However, since the insulation resistances of the motors other than the target for measurement are connected in parallel with the resistance of the current detector, measurement accuracy degrades unless the insulation resistance of the motors other than the target for measurement is sufficiently high.

This method is characterized in that degradation of measurement accuracy tends to be greater as the insulation resistance of the motor to be measured becomes smaller, and it becomes impossible to perform exact measurement when an extremely low insulation resistance such as a ground-faulted motor or the like is included.

On the other hand, in the above method (B), when each motor has a high insulation resistance, measurement accuracy lowers due to influence from the leakage currents flowing through the semiconductor switching elements. However, as mentioned above, it is possible achieve measurement even if a ground-faulted motor is included. Further, since the lower the insulation resistance of the motor to be measured is the greater the current flowing at the time of measurement becomes, the influence from the leakage currents flowing through the semiconductor switching elements becomes relatively smaller, so that measurement accuracy becomes higher.

In making a comparison between the above (A) and (B), (A) and (B) show such a reciprocal relationship that (A) can produce higher measurement accuracy than (B) when each motor has a high insulation resistance, whereas (B) can produce higher measurement accuracy than (A) when each motor has a low insulation resistance.

Making use of this relationship, the reference value based on which the insulation resistance detector should select either method (A) or (B) is determined so that among (A) and (B), a method that can produce higher measurement accuracy can be selected without fail at any time.

Specifically, for (A) it is possible to determine the magnitude of measurement error in measuring insulation resistance, based on the magnitude relation between the combined resistance of the parallel-connected insulation resistances of the motors other than the target for measurement and the value of the resistance of the current detector. For (B) it is possible to determine the magnitude of measurement error in measuring insulation resistance, from the magnitude of leakage current flowing through the semiconductor switching elements in the inverter units to which a motor other than the target for measurement is connected. By considering these measurement errors, it is possible to set up a resistance value for the reference value which at any time enables selection of either (A) or (B) that can produce higher accuracy.

It is also possible to set up a reference value by considering the resistance of the current detector and the magnitude of leakage current when the semiconductor switching elements used in the inverter units are high in temperature.

Since the magnitude of the leakage current through semiconductor switching elements, which dominates the measurement accuracy of (B), varies greatly depending on the temperature of the semiconductor switching elements as stated above, instead of a fixed value the reference value may be changed depending on the temperature of semiconductor switching elements of each inverter.

Next, it is determined at Step S212 whether measurement of insulation resistance on all the motors has been completed. If measurement of insulation resistance on all the motors has not been completed, the control returns to Step S207 to continue measurement of insulation resistance. On the other hand, when measurement of insulation resistance on all the motors has been completed, at Step S213 the insulation resistance of the motor to be measured is calculated from the measured current and voltage. Finally, at Step S214 the second switch 9 is returned to off-state and all the semiconductor switching elements in every inverter are turned off.

The process of measuring insulation resistance using the motor drive device according to the third embodiment of the present invention is also all executed by the insulation resistance detector of the motor drive "insulation resistance detector" 70 is realized by a microcomputer, which executes a series of measuring procedures described above in accordance with the flowchart given in FIG. 13.

The Fourth Embodiment

Next, a motor drive device according to the fourth embodiment of the present invention will be described. The configuration of the motor drive device according to the fourth embodiment is the same as that of the motor drive device according to the second embodiment.

A motor drive device according to the fourth embodiment of the present invention includes: a converter unit 100 having a rectifier circuit 3 configured to rectify AC voltage supplied from an AC power supply 2 via a first switch 1 into DC voltage; a power supply unit 4 configured to smooth the DC voltage rectified by the rectifier circuit 3 through a capacitor 41; a plurality of inverter units 501 to 503 configured to convert the DC voltage from the power supply unit 4 to AC voltage to drive multiple motors 61 to 63, respectively, by switching operation of the semiconductor switching elements in an upper arm, connected between a positive-side terminal of the capacitor 41, i.e., the DC link unit plus-side terminal 42 and the motor coil as well as the semiconductor switching elements in a lower arm, connected between a negative-side terminal of the capacitor 41, i.e., the DC link unit minus-side terminal 42 and the motor coil; a second switch 9 that connects the negative-side terminal of the capacitor 41 to the earth; a current detector 7 for measuring the current flowing between the negative-side terminal of the capacitor 41 and the earth; a voltage detector 8 configured to measure voltage between both ends of the capacitor 41; an insulation resistance detector 70 that detects insulation resistance of multiple motors 61 to 63 respectively driven by plurality of inverter units 501 to 503, and is characterized in that the drive circuit of semiconductor switching elements in the upper arm is formed of a bootstrap circuit, the insulation resistance detector 70 determines combined resistance of the insulation resistance of all the motors from measured current by the current detector 7 and measured voltage by the voltage detector 8 in a condition that the operation of motors 61 to 63 is stopped, the first switch 1 is turned off, and the second switch 9 is turned on, switching operation is performed for groups of semiconductor switching elements in the upper and lower arms of all the inverter units, by turning on and off the group of semiconductor switching elements in the upper arm and the group of semiconductor switching elements in the lower arm, alternately, so as to charge the bootstrap circuits in the upper arm when the semiconductor switching elements in the lower arm are in on-state; when the combined resistance is equal to or higher than a reference value, the insulation resistance detector 70 determines the insulation resistance of the motors selected as the target for measurement from measured current by the current detector and measured voltage by the voltage detector in a condition that switching operation of alternately turning on and off the group of semiconductor switching elements in the upper arm and the group of semiconductor switching elements in the lower arm in the inverter unit to which an arbitrary motor selected to be measured is connected is performed, so as to charge the bootstrap circuits in the upper arm when the semiconductor switching elements in the lower arm are in on-state, all the semiconductor switching elements in the lower arm of the inverter units to which a motor other than the target for measurement is connected are set in on-state; and when the combined resistance is lower than the reference value, the insulation resistance detector 70 determines the insulation resistance of the motor selected as the target for measurement from the measured current by the current detector 7 and the measured voltage by the voltage detector 8 in the condition that switching operation of alternately turning on and off the upper arm group of semiconductor switching elements and the lower arm group of semiconductor switching elements in the inverter unit to which an arbitrary motor selected as the target for measurement is connected is performed, so as to charge the bootstrap circuits in the upper arm when the semiconductor switching elements in the lower arm are in on-state, and all the semiconductor switching elements of the inverter units to which a motor other than the target for measurement is connected are set in off-state.

The motor drive device according to the fourth embodiment of the present invention is a motor drive device with a plurality of inverter units for driving multiple motors, in which the drive circuit of an upper arm semiconductor switching element in the inverter is formed of a bootstrap circuit and to which the same configuration as that of the third embodiment is applied.

FIG. 14 is a flow chart for explaining the procedural steps of an insulation resistance detecting process using the motor drive device according to the fourth embodiment of the present invention. Similarly to the third embodiment, the insulation resistance detector 70 begins with handling all the motors connected to the motor drive device as the target for measurement and measures the insulation resistance of all the motors collectively at the same time to determine the combined resistance value of the insulation resistances of all the motors (Steps S303 to S306). Next, at Step S307 the measuring method for measuring the insulation resistance of an arbitrary motor that is selected from the multiple motors as the target for measurement is selected depending on whether the previously measured insulation resistance of all the motors is equal to or greater than a reference value, or smaller than the reference value. This operational procedures are the same as those of the motor drive device according to the third embodiment of the present invention.

However, in the case of the inverters equipped with bootstraps, instead of performing measurement while the semiconductor switching elements on one arm side in the inverter to which the motor to be measured is connected are kept on, measurement is performed by conducting switching operation of turning on and off the upper and lower arm sides alternately. This is the distinctive point of this embodiment.

Also in the case of the inverters equipped with bootstraps, measurement is performed by selecting the optimal method depending on whether the preceding measurement of the combined resistance of the insulation resistances of all the motors is equal to or higher than the reference value or lower than the reference lever. Description will be given for two different cases.

(C) A case where the combined resistance of the insulation resistances of all the motors is equal to or higher than the reference value:—

Since it can be determined that there is no ground-faulted that is extremely low in insulation resistance, exact measurement of insulation resistance is performed using the invention of the second embodiment explained above.

Specifically, at Step S308 measurement of insulation resistance is performed while the lower arm semiconductor switching elements of the inverters to which a motor other than the target for measurement is connected are set in on-state. Since the specific example of the measurement in the case of (C) has been already described with reference to FIG. 11, detailed description is omitted.

(D) A case where the combined resistance of the insulation resistances of all the motors is lower than the reference value:—

In this case, since it can be determined that a motor such as a ground-faulted motor or the like that is extremely low in insulation resistance is included, similarly to Step S209 in the third embodiment, measurement of insulation resistance is performed by turning off all the semiconductor switching elements of the inverters to which a motor other than the target for measurement is connected, at Step S309.

Specifically, while the motors are stopped with the first switch 1 off and the second switch 2 on, the semiconductor switching elements of the inverters to which a motor other than the target for measurement is connected, are all turned off at Step S309. Next, at Step S310, as to the upper and lower arm groups of semiconductor switching elements of the inverter unit to which an arbitrary motor selected as the target for measurement is connected, switching operation of turning on and off the upper and lower arm groups alternately is conducted so as to charge the bootstrap circuits in the upper arm when the lower arm semiconductor switching elements are in on-state. Then, at Step S311 the current detector measures current and the voltage detector measures voltage so as to determine the insulation resistance of the motor selected as the target for measurement from the obtained current and voltage.

Either of Steps S310 and S309 may be done first, or these steps may be done simultaneously.

In the example of FIG. 11, while all the motors are stopped with the first switch 1 turned off and the second switch 2 turned on, as to the IGBTs of the first inverter unit 501 to which the motor 61 to be measured is connected, the U-phase upper arm IGBT 511 is turned off and the U-phase lower arm IGBT 521 is turned on. Then, the U-phase upper arm IGBT 511 is turned on and the U-phase lower arm IGBT 521 is turned off. This switching operation is alternately repeated by a PWM signal with a duty ratio of 50%.

By turning off all the IGBTs of second and third inverter units 502 and 503 to which second and third motors 62 and 63 other than the target for measurement are respectively connected, current detector 7 and voltage detector 8 measure current and voltage, respectively at the same time so as to determine the insulation resistance of the motor selected as the target for measurement from the obtained current and voltage.

The operation at Steps S312 to S314 is the same as that at Steps S212 to S214 in FIG. 13, so that detailed description is omitted.

The process of measuring insulation resistance using the motor drive device according to the fourth embodiment of the present invention is also all executed by the insulation resistance detector 70 of the motor drive device. The insulation resistance detector 70 can be realized by a microcomputer, which executes a series of measuring procedures described above in accordance with the flowchart.

According to the present invention, it is possible to detect degradation in insulation resistance with higher precision compared to the prior art when an arbitrary motor selected from multiple motors is measured.

What is claimed is:

1. A motor drive device comprising:
a converter unit having a rectifier circuit configured to rectify AC voltage supplied from an AC power supply via a first switch into DC voltage;
a power supply unit configured to smooth the DC voltage rectified by the rectifier circuit through a capacitor;
a plurality of inverter units configured to convert the DC voltage from the power supply unit to AC voltage to drive multiple motors, respectively, by switching operation of semiconductor switching elements in an upper arm, connected between a positive-side terminal of the capacitor and a motor coil as well as semiconductor switching elements in a lower arm, connected between a negative-side terminal of the capacitor and the motor coil;
a second switch configured to connect one terminal of the capacitor to the earth;
a current detector configured to measure current flowing between the one terminal of the capacitor and the earth;
a voltage detector configured to measure voltage between both ends of the capacitor; and,
an insulation resistance detector configured to detect insulation resistance which is resistance between a motor coil of a motor selected as a target for measurement and the earth, based on current and voltage measured in a condition that operation of the motors is stopped, the first switch is turned off, the second switch is turned on, wherein at least one of the semiconductor switching elements connected between the positive side terminal of the capacitor and the motor coil of the motor selected as a target for measurement is turned on, and wherein at least one of the semiconductor switching elements connected between the negative terminal of the capacitor and the motor coil of the motor other than the motor to be measured is turned on.

2. A method of detecting insulation resistance of motors, comprising the steps of:
rectifying AC voltage supplied from an AC power supply via a first switch into DC voltage, by a rectifier circuit;
smoothing the DC voltage rectified by the rectifier circuit through a capacitor, by a power supply unit;
converting the DC voltage from the power supply unit to AC voltage to drive multiple motors, respectively by a plurality of inverter units based on switching operation of semiconductor switching elements in an upper arm, connected between a positive-side terminal of the capacitor and a motor coil as well as semiconductor switching elements in a lower arm, connected between a negative-side terminal of the capacitor and the motor coil;
connecting one terminal of the capacitor to the earth by a second switch;

measuring current flowing between the one terminal of the capacitor and the earth by a current detector;

measuring voltage between both ends of the capacitor by a voltage detector;

stopping the operation of the motors and turning off the first switch;

setting the second switch into on-state;

turning on one of the semiconductor switching elements that are connected between the positive-side terminal of the capacitor and the motor coil of the motor to be measured;

turning on one of the semiconductor switching elements connected between the negative-side terminal of the capacitor and the motor coil of a motor other than the motor to be measured;

measuring current by the current detector and measuring voltage by the voltage detector; and detecting insulation resistance which is a resistance between a motor coil of a motor selected as a target for measurement and the earth, based on the measured current and voltage.

\* \* \* \* \*